US012585962B2

(12) United States Patent
Nam et al.

(10) Patent No.: US 12,585,962 B2
(45) Date of Patent: Mar. 24, 2026

(54) NANO COMPUTING DEVICE AND METHOD OF OPERATING NANO COMPUTING DEVICE

(71) Applicant: Seoul National University R&DB Foundation, Seoul (KR)

(72) Inventors: Jwa-Min Nam, Seoul (KR); Sungi Kim, Seoul (KR); Namjun Kim, Seoul (KR)

(73) Assignee: SEOUL NATIONAL UNIVERSITY R&DB FOUNDATION, Seoul (KR)

( * ) Notice: Subject to any disclaimer, the term of this patent is extended or adjusted under 35 U.S.C. 154(b) by 1303 days.

(21) Appl. No.: 17/328,765

(22) Filed: May 24, 2021

(65) Prior Publication Data

US 2021/0365798 A1 Nov. 25, 2021

(30) Foreign Application Priority Data

May 25, 2020 (KR) ........................ 10-2020-0062426
May 4, 2021 (KR) ........................ 10-2021-0057915

(51) Int. Cl.
   *G06N 3/123* (2023.01)
   *G11C 13/02* (2006.01)
(52) U.S. Cl.
   CPC ............. *G06N 3/123* (2013.01); *G11C 13/02* (2013.01)
(58) Field of Classification Search
   None
   See application file for complete search history.

(56) References Cited

FOREIGN PATENT DOCUMENTS

| KR | 1020190135846 | 12/2019 |
| WO | 2019003228 | 1/2019 |
| WO | 2019231173 | 12/2019 |

OTHER PUBLICATIONS

Seo, J., Kim, S., Park, H.H., Choi, D.Y. and Nam, J.M., Feb. 22, 2019. Nano-bio-computing lipid nanotablet. Science advances, 5(2), p.eaau2124. (Year: 2019).*
Ma, D.L., He, H.Z., Chan, D.S.H. and Leung, C.H., 2013. Simple DNA-based logic gates responding to biomolecules and metal ions. Chemical Science, 4(9), pp. 3366-3380. (Year: 2013).*
Jinyoung Seo, et al., "Nano-bio-computing lipid nanotablet", Science Advances, (2019), vol. 5, pp. 1-13.
Sungi Kim, et al., "Optokinetically Encoded Nanoprobe-Based Multiplexing Strategy for MicroRNA Profiling", J. Am. Chem. Soc., (2017), vol. 139, pp. 3558-3566.
Young Kwang Lee, et al., "Massively Parallel and Highly Quantitative Single-Particle Analysis on Interactions between Nanoparticles on Supported Lipid Bilayer", J. Am. Chem. Soc., (2014), vol. 136, pp. 4081-4088.

(Continued)

*Primary Examiner* — G. Steven Vanni
*Assistant Examiner* — Meredith Abbott Vassell
(74) *Attorney, Agent, or Firm* — CANTOR COLBURN LLP

(57) ABSTRACT

A nano computing device includes: a nanoparticle memory including a first molecule bound so as to store a molecular input; a nanoparticle reporter including a second molecule bound so as to generate an output; and a nanoparticle floater including at least two third molecules and fourth molecules so as to be bound to one of the nanoparticle memory and the nanoparticle reporter based on the molecular input and an instruction molecule.

22 Claims, 25 Drawing Sheets

Specification includes a Sequence Listing.

(56) References Cited

OTHER PUBLICATIONS

European Search Report—European Patent Application No. 21175819.8 dated Nov. 5, 2021.

Yahui Guo, et al. "Logic Gates Based On G-Quadruplexes:Principles and Sensor Applications", Mikrochimica Acta, (Sep. 12, 2015), vol. 183, No. 1, pp. 21-34.

* cited by examiner

|  |  | $\tau_{1/2}$ (min) | $k_i$ (min$^{-1}$) |
|---|---|---|---|
| | 1 nM | 5.5 | 0.056 |
| $M_0$ Trap DNA | 2 nM | 3.6 | 0.14 |
| | 8 nM | 3.6 | 0.13 |
| | 1 nM | 4.4 | 0.098 |
| $M_1$ Trap DNA | 2 nM | 2.2 | 0.23 |
| | 8 nM | 1.9 | 0.26 |
| | 1 nM | 17.7 | 0.00 |
| Report DNA | 2 nM | 7.8 | 0.01 |
| | 3 nM | 5.5 | 0.02 |

In early state

Weak transient interaction

In later state

Strong multivalent interaction (A)

(B)

$$x_i = \{0, 1\} \qquad w_{i,j} = \{1, 0, -1\}$$

$$b_j = -h \ (h \text{ is the number of } w_{i,j} \text{ equal to } 1)$$

$$v_j = \begin{cases} 1 & \sum_{i=1}^{n} w_{i,j} \cdot x_i + b_j \geq 0 \\ 0 & \text{otherwise} \end{cases}$$

$$y = \begin{cases} 1 & \sum_{j=1}^{m} v_j > 0 \\ 0 & \text{otherwise} \end{cases}$$

NANO COMPUTING DEVICE AND METHOD OF OPERATING NANO COMPUTING DEVICE

CROSS-REFERENCE TO RELATED APPLICATION

This application claims priority to and the benefits of Korean Patent Application No. 10-2020-0062426, which was filed with the Korean Intellectual Property Office on May 25, 2020, and Korean Patent Application No. 10-2021-0057915, which filed with the Korean Intellectual Property Office on May 4, 2021, the entire contents of which are incorporated herein by reference.

BACKGROUND OF THE INVENTION

(a) Field of the Invention

The present disclosure relates to a nano computing device and a method of operating a nano computing device.

(b) Description of the Related Art

The first electronic computing machine could execute only a fixed program, and reprogramming the computer required difficult and extensive physical rewiring and reconstructing of the entire machine. John von Neumann developed Von Neumann Architecture (VNA) in 1945, and the VNA is a storage-program computer in which commands and data are stored in a memory. The VNA may execute a set of commands, that is, a program, by a design. The VNA sequentially fetches stored data, and commands which are input from a user and stored in the memory, and processes information, stores a processing result, and generates an output. Due to the powerful programming function, the VNA is being applied to most modern computers and quantum computing.

A molecular computing using nanostructures may enable a wide range of technologies including nanoparticle logic gates, single-molecule biosensors, and logic sensing inside/on living cells. However, as in early electronic computing machines, most of the nanostructure function (software) is defined with a structure (hardware) of the function, so that the nanostructure-driven molecular computing system is limited to operate a single program. Therefore, implementing other operations requires extensive redesign and remixing of the nanostructures, and it is often challenging or almost impossible to scale up computing powers. Moreover, the single operation quickly consumes fuel molecules and yields irreversible structural changes in the nanostructures, so that it is difficult to re-operate the nanostructure-driven molecular computing system and reversibility of the computing system may be hampered.

Korean Patent Application No. 10-2018-0061345 describes a molecular computing platform with nanoparticles on a lipid bilayer as a lipid nanotablet (LNT). The supported lipid bilayer SLB provides a two-dimensional space for tethered nanoparticles, and mobility of the nanoparticle is controlled by the number of biotin-streptavidin-biotin links between the nanoparticle and the SLB, and it is possible to limit a space for immobile particles and assemble/disassemble mobile particles on the same flowable lipid surface.

The above information disclosed in this Background section is only for enhancement of understanding of the background of the invention, and therefore it may contain information that does not form the prior art that is already known in this country to a person of ordinary skill in the art.

SUMMARY OF THE INVENTION

In a lipid nanotablet, various ligand modifications and nanoparticle network designs have made modular logic circuit design possible to some extent, but the functional completeness of Boolean logic capable of expressing all logical operations have not ydet been achieved.

Further, a pre-designed nanoparticle set is required for each logic circuit, and only a fixed logic circuit is operable in a single LNT, and there is still no generally applicable computing architecture, which is capable of greatly improving applicability, versatility, and practicality of the nanoparticle-driven molecular computing.

Since there is no expandable nanoparticle-based computing architecture, the use of nanoparticles is inevitably limited in manipulating and processing information in a molecular computing method, and potential of nanoparticles is also limited.

An exemplary embodiment of the present invention provides a nano computing device, including: a nanoparticle memory including a first molecule bound so as to store a molecular input; a nanoparticle reporter including a second molecule bound so as to generate an output; and a nanoparticle floater including at least two third molecules and fourth molecules so as to be bound to one of the nanoparticle memory and the nanoparticle reporter based on the molecular input and an instruction molecule.

The molecular input may include a molecular input indicating logic 1.

The instruction molecule may include at least one of a trap DNA that binds the nanoparticle floater to the nanoparticle memory and a report DNA that binds the nanoparticle floater to the nanoparticle reporter.

The trap DNA may include: a first trap DNA that binds the nanoparticle floater and the nanoparticle memory when a storage state of the nanoparticle memory indicates logic 0; and a second trap DNA that binds the nanoparticle floater and the nanoparticle memory when a storage state of the nanoparticle memory indicates logic 1.

The first trap DNA may bind the first molecule and the third molecule when the storage state of the nanoparticle memory indicates logic 0.

The second trap DNA may bind the molecular input bound to the first molecule and the third molecule when the storage state of the nanoparticle memory indicates logic 1.

A first reaction rate between the nanoparticle memory and the nanoparticle floater by a first instruction molecule among the instruction molecules may be faster than a second reaction rate between the nanoparticle reporter and the nanoparticle floater by a second instruction molecule among the instruction molecules.

The first instruction molecule may include a trap DNA that binds the nanoparticle floater to the nanoparticle memory, the second instruction molecule may include a report DNA that binds the nanoparticle floater to the nanoparticle reporter, and a rate difference between the first reaction rate and the second reaction rate may be adjusted according to at least one of a DNA hybridization domain configuring each of the first to fourth molecules, hybridization domains of the trap DNA and the report DNA, a concentration of the nanoparticle memory, a concentration of the nanoparticle reporter, a concentration of the nanoparticle floater, and a concentration of the trap DNA and the report DNA.

The nanoparticle memory and the nanoparticle reporter may be fixed to a supported lipid bilayer membrane, and the nanoparticle floater may be mobile on the supported lipid bilayer membrane.

Another exemplary embodiment of the present invention provides a nano computing device, including: a plurality of molecular inputs; a plurality of nanoparticle memories configured to store the plurality of molecular inputs; a plurality of instruction molecules programmed for performing a logic operation; a plurality of nanoparticle reporters configured to determine an output; and a plurality of nanoparticle floaters bound to the plurality of nanoparticle memory or the plurality of nanoparticle reporters based on the molecular inputs and the instruction molecules.

The plurality of molecular inputs may include at least one of two types of a first molecular input and a second molecular input, and the plurality of nanoparticle memory may include a first nanoparticle memory and a second nanoparticle memory that store at least one of the first molecular input and the second molecular input.

The plurality of nanoparticle floaters may be bound to the first nanoparticle memory by a first trap molecule among the plurality of instruction molecules, may be bound to the second nanoparticle memory by a second trap molecule among the plurality of instruction molecules, and may be bound to one of the plurality of nanoparticle reporters by a report molecule among the plurality of instruction molecules.

The first trap molecule may bind one of the plurality of nanoparticle floaters to the first nanoparticle memory when a molecular input is not stored in the first nanoparticle memory, and the second trap molecule may bind one of the plurality of nanoparticle floaters to the second nanoparticle memory when a molecular input is not stored in the second nanoparticle memory.

The first trap molecule may bind one of the plurality of nanoparticle floaters to the first nanoparticle memory when a molecular input is not stored in the first nanoparticle memory, and the second trap molecule may bind one of the plurality of nanoparticle floaters to the second nanoparticle memory when a second molecular input is stored in the second nanoparticle memory.

The first trap molecule may bind one of the plurality of nanoparticle floaters to the first nanoparticle memory when a first molecular input is stored in the first nanoparticle memory, and the second trap molecule may bind one of the plurality of nanoparticle floaters to the second nanoparticle memory when a second molecular input is stored in the second nanoparticle memory.

The plurality of nanoparticle floaters may include two types including a first nanoparticle floater and a second nanoparticle floater, the first nanoparticle floater may be bound to the first nanoparticle memory by a first trap molecule among the plurality of instruction molecules and may be bound to one of the plurality of nanoparticle reporters by a report molecule among the plurality of instruction molecules, and the second nanoparticle floater may be bound to the first nanoparticle memory by a second trap molecule among the plurality of instruction molecules, may be bound to the second nanoparticle memory by a third trap molecule among the plurality of instruction molecules, and may be bound to another one of the plurality of nanoparticle reporters by a report molecule among the plurality of instruction molecules.

The first trap molecule may bind the first nanoparticle floater and the first nanoparticle memory when a molecular input is not stored in the first nanoparticle memory, the second trap molecule may bind the second nanoparticle floater and the first nanoparticle memory when a first molecular input is stored in the first nanoparticle memory, and the third trap molecule may bind the second nanoparticle floater and the second nanoparticle memory when a molecular input is not stored in the second nanoparticle memory.

The first trap molecule may bind the first nanoparticle floater and the first nanoparticle memory when a first molecular input is not stored in the first nanoparticle memory, the second trap molecule may bind the second nanoparticle floater and the first nanoparticle memory when a molecular input is not stored in the first nanoparticle memory, and the third trap molecule may bind the second nanoparticle floater and the second nanoparticle memory when a second molecular input is stored in the second nanoparticle memory.

The plurality of nanoparticle floaters may include two types including a first nanoparticle floater and a second nanoparticle floater, and the first nanoparticle floater may be bound to the first nanoparticle memory by a first trap molecule among the plurality of instruction molecules, may be bound to the second nanoparticle memory by a second trap molecule among the plurality of instruction molecules, and may be bound to one of the plurality of nanoparticle reporters by a report molecule among the plurality of instruction molecules, and the second nanoparticle floater may be bound to the first nanoparticle memory by a third trap molecule among the plurality of instruction molecules, may be bound to the second nanoparticle memory by a fourth trap molecule among the plurality of instruction molecules, and may be bound to another one of the plurality of nanoparticle reporters by a report molecule among the plurality of instruction molecules.

The first trap molecule may bind the first nanoparticle floater and the first nanoparticle memory when a molecular input is not stored in the first nanoparticle memory, the second trap molecule may bind the first nanoparticle floater and the second nanoparticle memory when a second molecular input is stored in the second nanoparticle memory, the third trap molecule may bind the second nanoparticle floater and the first nanoparticle memory when a first molecular input is stored in the first nanoparticle memory, and the fourth trap molecule may bind the second nanoparticle floater and the second nanoparticle memory when a molecular input is not stored in the second nanoparticle memory.

The first trap molecule may bind the first nanoparticle floater and the first nanoparticle memory when a molecular input is not stored in the first nanoparticle memory, the second trap molecule may bind the first nanoparticle floater and the second nanoparticle memory when a molecular input is not stored in the second nanoparticle memory, the third trap molecule may bind the second nanoparticle floater and the first nanoparticle memory when a first molecular input is stored in the first nanoparticle memory, and the fourth trap molecule may bind the second nanoparticle floater and the second nanoparticle memory when a second molecular input is stored in the second nanoparticle memory.

Still another exemplary embodiment of the present invention provides a nano computing device including: an input layer including a plurality of nanoparticle memories; a hidden layer including a plurality of nanoparticle floaters; and an output layer including a plurality of nanoparticle reporters, in which the nano computing device is programmed with a nanoparticle neural network including a plurality of instruction molecules corresponding to weights between the input layer and the hidden layer and between the hidden layer and the output layer.

The plurality of instruction molecules may include a plurality of trap molecules that controls binding between the plurality of nanoparticle memories and the plurality of nanoparticle floaters based on a storage state of the plurality of nanoparticle memories, and the type of the plurality of trap molecules may be different according to the nanoparticle neural network.

Yet another exemplary embodiment of the present invention provides a method of operating a nano computing device including a plurality of molecular inputs, a plurality of nanoparticle memories, and a plurality of nanoparticle reporters, the method including: binding first instruction molecules among a plurality of instruction molecules programmed so as to perform the logic operation to the plurality of nanoparticle memories; and binding second instruction molecules among the plurality of instruction molecules to the plurality of nanoparticle reporters, in which a progress rate of the operation of binding the first instruction molecules to the plurality of nanoparticle memories is faster than a progress rate of the operation of binding the second instruction molecules to the plurality of nanoparticle reporters.

The method may further include binding the plurality of molecular inputs to the plurality of nanoparticle memories, in which places in which the first instruction molecules are bound to the plurality of nanoparticle memories may be changed according to the plurality of molecular inputs bound to the plurality of nanoparticle memories.

Unlike the basic nano device in the related art, the biological machine or the electric computer according to the exemplary embodiment of the present invention may reversibly return to an initial state to execute each operation several times. For example, many enzymatic proteins are reversibly activated and inactivated by phosphorylation and dephosphorylation by kinase and phosphatase to control their functions similar to a switch.

BRIEF DESCRIPTION OF THE DRAWINGS

FIG. 2 is a diagram illustrating an operation of the NVNA according to the exemplary embodiment.

FIG. 11 is a diagram illustrating a half assemble period and an initial ratio constant that are kinetics data.

FIG. 20 is a diagram illustrating a multilayer perceptron for an XNOR logic gate.

FIG. 25 is a diagram illustrating an operation of a fan output logic circuit according to the exemplary embodiment.

DETAILED DESCRIPTION OF THE EMBODIMENTS

Figure 1:
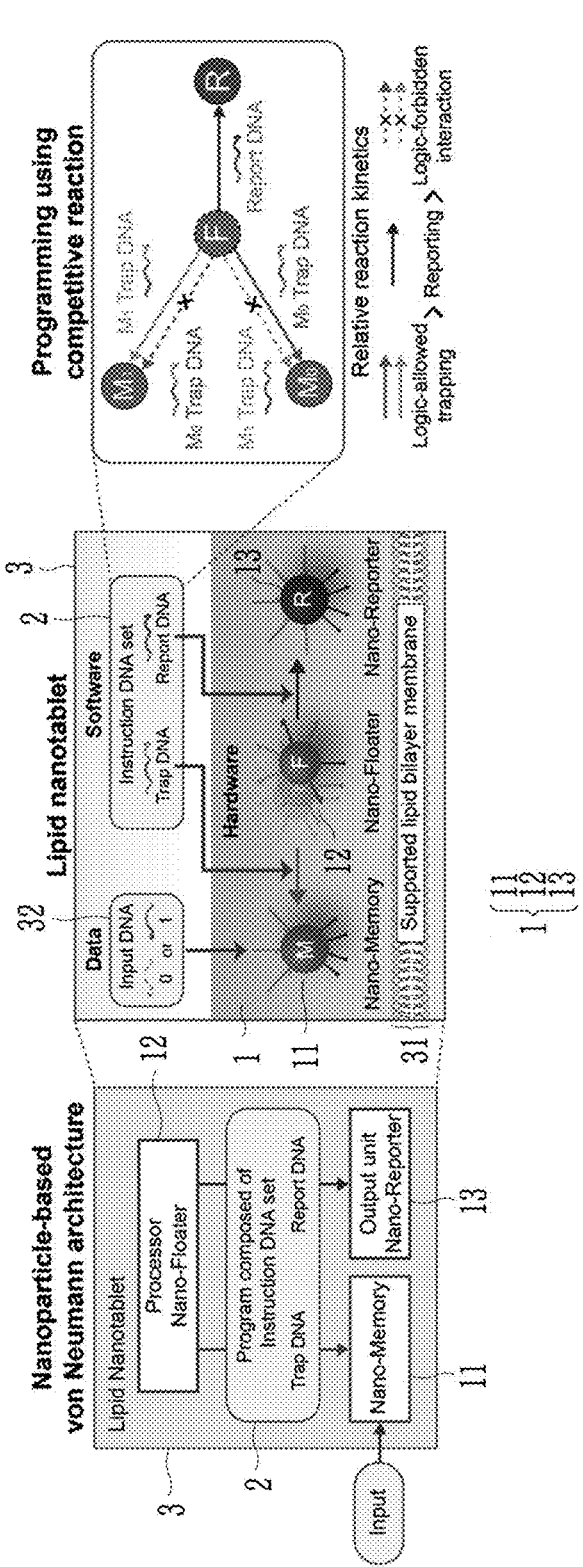
FIG. 1 is a schematic diagram illustrating a Nanoparticle-based Von Neumann Architecture (NVNA) according to an exemplary embodiment.

An exemplary embodiment according to the present invention implements a Nanoparticle-based Von Neumann Architecture (NVNA) by applying Von Neumann Architecture (VNA) to a lipid nanotablet which is capable of operating various programs without reconfiguring a computer. That is, in the exemplary embodiment, to create a stored-program device stored for programming in a molecular computing platform, the concept of memory that stores molecular information is incorporated to the VNA with nanoparticles. The stored molecular information is processed according to an input instruction code and the instruction code may be input by a user. The nanostructure (hardware) and the instruction code (software) are separated, so that the user is capable of performing multiple computational tasks only with updating of software without fabricating a new device every single time, thereby improving modularity and scalability in information processing in LNT.

According to the exemplary embodiment, arbitrary logic computing may be programmed several times on a single chip without reassembling. In the system, the nanoparticle on the lipid chip functions as hardware having characteristics of a memory, a processor, and an output device. Further, the system is software to provide molecular instructions for facile programming of logic circuits and uses DNA strands. Through the computing architecture, nanoparticles of one group form a feed-forward neural network, a perceptron, which may implement functionally complete Boolean logic operations. The NVNA according to the exemplary embodiment of the present invention provides a programmable, resettable, and scalable computing architecture and circuit board to form nanoparticle neural networks and make logical decisions.

Hereinafter, an exemplary embodiment disclosed the present specification will be described in detail with reference to the accompanying drawings, and the same or similar constituent element is denoted by the same and similar reference numeral, and a repeated description thereof will be omitted. Suffixes, "module" and "unit" for a constituent element used for the description below are given or mixed in consideration of only easiness of the writing of the specification, and the suffix itself does not have a discriminated meaning or role. Further, in describing the exemplary embodiment disclosed in the present disclosure, when it is determined that a detailed description relating to well-known functions or configurations may make the subject matter of the exemplary embodiment disclosed in the present disclosure unnecessarily ambiguous, the detailed description will be omitted. Further, the accompanying drawings are provided for helping to easily understand exemplary embodiments disclosed in the present specification, and the technical spirit disclosed in the present specification is not limited by the accompanying drawings, and it will be appreciated that the present invention includes all of the modifications, equivalent matters, and substitutes included in the spirit and the technical scope of the present invention.

Terms including an ordinary number, such as first and second, are used for describing various constituent elements, but the constituent elements are not limited by the terms. The terms are used only to discriminate one constituent element from another constituent element.

It should be understood that when one constituent element is referred to as being "coupled to" or "connected to" another constituent element, one constituent element can be directly coupled to or connected to the other constituent element, but intervening elements may also be present. By contrast, when one constituent element is referred to as being "directly coupled to" or "directly connected to" another constituent element, it should be understood that there are no intervening elements.

In the present application, it will be appreciated that terms "including" and "having" are intended to designate the existence of characteristics, numbers, steps, operations, constituent elements, and components described in the specification or a combination thereof, and do not exclude a possibility of the existence or addition of one or more other characteristics, numbers, steps, operations, constituent elements, and components, or a combination thereof in advance.

FIG. 1 is a schematic diagram illustrating a Nanoparticle-based Von Neumann Architecture (VNNA) according to an exemplary embodiment.

FIG. 1 illustrates that the nano-computing device according to the NVNA is implemented on a Lipid Nano Tablet (LNT) chip, but the present invention is not limited thereto. The NVNA may be implemented on another configuration which is capable of providing the same function, instead of the lipid nanotablet LNT chip.

As illustrated in FIG. 1, an LNT 3 includes software 2 composed of instruction DNAs, a supported lipid bilayer membrane 31 that is a substrate, and a hardware chip 1 implemented with nanoparticles in a solution. The input data may be divided into logical inputs "0" and "1", and may be implemented with molecular input, and the molecular input may be implemented with DNA (hereinafter, "input DNA") 32. In FIG. 1, the hardware chip 1 may be implemented based on the supported lipid bilayer membrane 31, but the invention is not limited thereto, and the LNT chip 3 is illustrated as the nano-computing device according to the NVNA, but the nano-computing device according to the present invention is not limited to the LNT chip. Hereinafter, in order to describe the nano-computing device according to the present invention, the LNT chip that is an exemplary embodiment will be described. The hardware chip 1 includes three types of DNA-modified nanoparticles of a Nano-Memory (NM), a Nano-Floater (NF), and a Nano-Reporter (NR). Hereinafter, the nano-memory, the nano-floater, and the nano-reporter are described as "NM", "NF", and "NR". The NM 11 and the NR 13 are immobile nanoparticles that function as a molecular information storage device and an output unit. An instruction molecular set that is software may be composed of a set of instruction DNAs 2. The set of instruction DNAs 2 programs logical operation using a molecular input storage state of the NM 11 and a kinetics difference between nanoparticle reactions. The relative reaction kinetics for the nanoparticles is adjustable according to DNA hybridization domains bonded to the NM, NF, and NR, a nanoparticle concentration, and an instruction DNA concentration. That is, the reaction rate may be optimized by using the DNA hybridization domains, the nanoparticle concentration, and the instruction DNA concentration.

Like "Programming using competitive reaction" illustrated at the right-most side of FIG. 1, $M_0$ and $M_1$ are illustrated as the example of the NM 11, F is illustrated as an example of the NF 12, and R is illustrated as the example of the NR 13. A trap DNA is divided for each of $M_0$ and $M_1$ ($M_0$ Trap DNA and $M_1$ Trap DNA), and the relative reaction kinetics for the nanoparticles $M_0$, $M_1$, F, and R are decreased in an order of logic-allowed trapping, reporting, and logic-forbidden interaction. That is, by each trap DNA, the binding (logic-allowed trapping) between the nanoparticles $M_0$ and F, and $M_1$ and F is fast, and by the report DNA, binding (reporting) between the nanoparticles F and R is next fast. The logic-forbidden interaction does not occur, $M_0$ and F do not bind by the trap DNA $M_1$ Trap DNA for the nanoparticle $M_1$, and $M_1$ and F do not bind by the trap DNA $M_0$ Trap DNA for the nanoparticle $M_0$.

The software may be composed of a series of instruction DNAs 2 in a solution. For example, two types of instruction DNAs, the trap DNA, and the report DNA control the NF 12 to bind to the NM 11 or the NR 13 through the DNA hybridization. The instruction DNA 2 controls the NF 12 to bind to the NM 11 or the NR 13 with a different rate according to a different storage state. Accordingly, a mixture of the plurality of instruction DNAs 2 may generate a logical decision-making strategy according to a storage condition. Then, arbitrary logical computing may be programmed in the single LNT hardware chip 1.

The solution inside the supported lipid bilayer chamber illustrated at the center of FIG. 1 may be easily exchanged with the remaining nanoparticles tethered to the lipid membrane, so that multiple instructions may be transmitted to the LNT 3. In the electronic VNA, data and a command are fetched from a central processing unit through the same path known as a bus. The solution in the NVNA is similar to the bus in relation to information storage, processing, and resetting.

Figure 2:
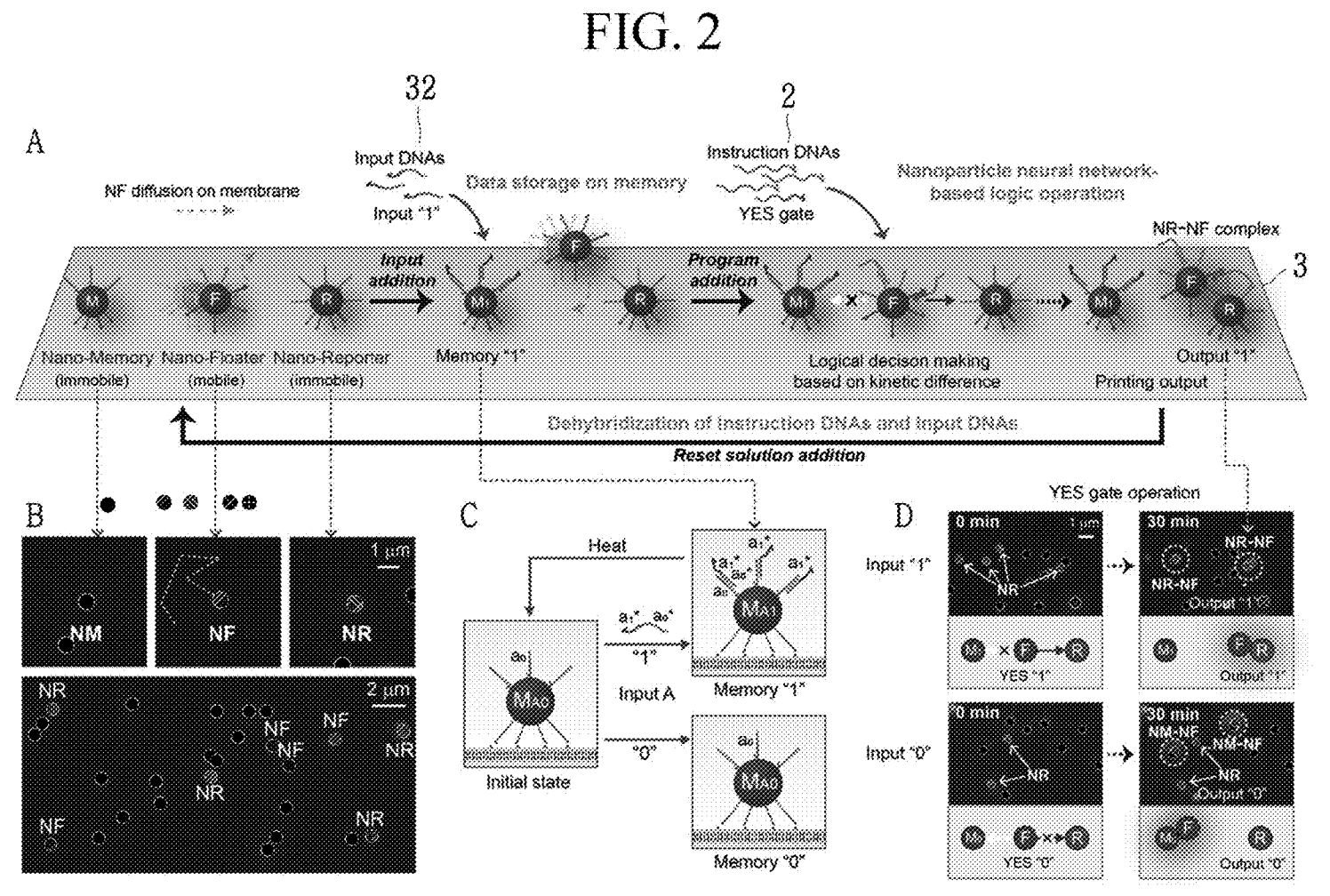

FIG. 2 is a diagram illustrating an operation of the NVNA according to the exemplary embodiment.

The operation executed by the NVNA follows three steps below.

As illustrated in A of FIG. 2, the nano-floater (NF) "F" is in a spreadable (mobile) state, and the MN "M" and the NR "R" are in a fixed (immobile) state on the membrane.

As illustrated in B of FIG. 2, time-lapse dark-field microscopic imaging can differentiate each nanoparticle on LNT via scattering color and mobility. In B of FIG. 2, all of the nanoparticles that are not labelled with "NF" and "NR" are NM. Each of the NM and the NR may be differentiated with distinct scattering color of green and blue from gold and silver nanoparticles. In B of FIG. 2, the NM that is the green particle is illustrated with a circle, the NR that is the blue particle is illustrated with a lattice-patterned circle, and the NF is illustrated with a hatched circle. The mobile nanoparticles, referred to as NFs, freely diffuse and collide with the immobile nanoparticles (NM and NR). The NFs act as a processing unit assembled with the NM or the NR in response to molecular information stored in the NM and external instruction codes (software) made of instruction DNAs.

In operation "input addition" illustrated in A of FIG. 2, an input solution is added and the input data is stored in the NM (M) (data storage on memory). Molecular input of the input solution may be implemented with the DNAs, and the input DNA corresponding to the molecular input is stored in the NM M through the DNA hybridization. For example, the input solution including the input DNA 32 corresponding to input "1" is added, and the NM M binds to the input DNA 32, so that the input "1" is stored in the NM (M). In A of FIG. 2, the NM to which the input DNA 32 binds is illustrated as "$M_1$".

As illustrated in C of FIG. 2, the single NM $Ma_0$ particle is a 1-bit memory device, and a bistable state is represented by "0" or "1". The NM $M^{40}$ state when an input is "0" is referred to as $NM_0$, and when the input is "1", NM $M_{A1}$ represents a DNA domain different from $NM_0$ ($NM_I$). By the storage of the molecular information, an exposed single-stranded domain of the NM $M_{A1}$ in the $NM_1$ state is changed, so that the exposed single-stranded domain of the NM $M_{A1}$ in the $NM_1$ state is different from an exposed single-stranded domain of the NM $M_{A0}$ in the $NM_0$ state. Further, the single strand bonded to the NM $M_{A1}$ may be detached by heat to return to an initial state. The single-stranded domain of the NM $M_{A1}$ becomes the same as the exposed single-stranded domain of the NM $M_{A0}$ in the $NM_0$ state.

Next, as illustrated in A of FIG. 2, a series of instruction DNAs 2 that encodes a specific logic circuit programmed with a Nanoparticle Neural Network (NNN) is added to the LNT 3. Then, the corresponding logic circuit is executed to generate an output.

In a "Program addition" operation illustrated in A of FIG. 2, as a result of an operation of a YES gate by the instruction DNAs 2, when the output of the logic operation is "1", NF F is assembled to NR R and output "1" is represented. When the output of the logic operation is "0", the NF F is trapped to the NM $M_1$, so that a reaction between the NF F and the NR R is not exhibited.

For example, as illustrated in D of FIG. 2, when the molecular input information is "1" and the YES gate is operated by the instruction DNAs 2, the NF F and the NR R are assembled, so that "1" is output as the result of the YES logic operation. When the molecular input information is "0" and the YES gate is operated by the instruction DNAs 2, the NF F is trapped to the NM $M_0$, so that "0" is output as a result of the YES logic operation.

As described above, the logic operation may be executed by supplying the instruction signal composed of a combination of instruction DNAs. That is, the logic operation may be performed by providing the instruction signal in the form of the combination of instruction DNAs that initiate the nanoparticle-nanoparticle assembly having the different kinetics according to the NM state. When the output signal is 0, all of the NFs are trapped by the memory device NM, but when a result of the logic operation is 1, the NF binds to the output device through the NF-NR assembly to report the output "1".

Subsequently, a reset solution is added to the existing solution to dehybridize all of the non-covalent DNA-DNA base pairings, and the LNT 3 returns to the initial state for the next execution.

In the "Reset solution addition" operation illustrated in A of FIG. 2, after the single execution, the computing chip may be reset to the initial state by adding a reset solution (for example, low salt and high temperature) which detaches all of the DNA base pairings including the input DNAs and the instruction DNAs.

Hereinafter, a software programming strategy using the instruction DNA will be described.

Figure 3:
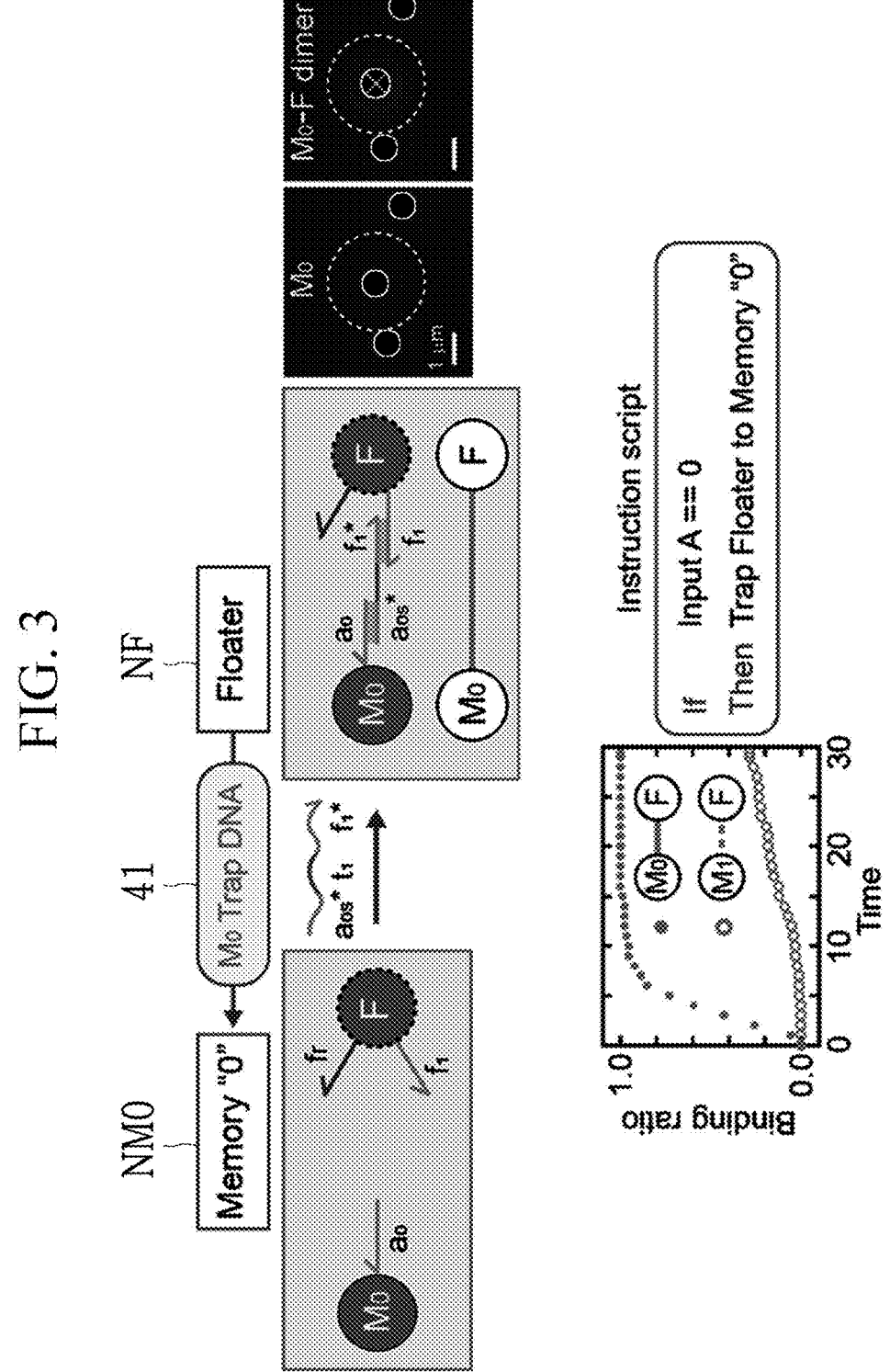
FIGS. 3 to 5 are diagrams illustrating reaction rates of three types of instruction DNA.
Figure 4:
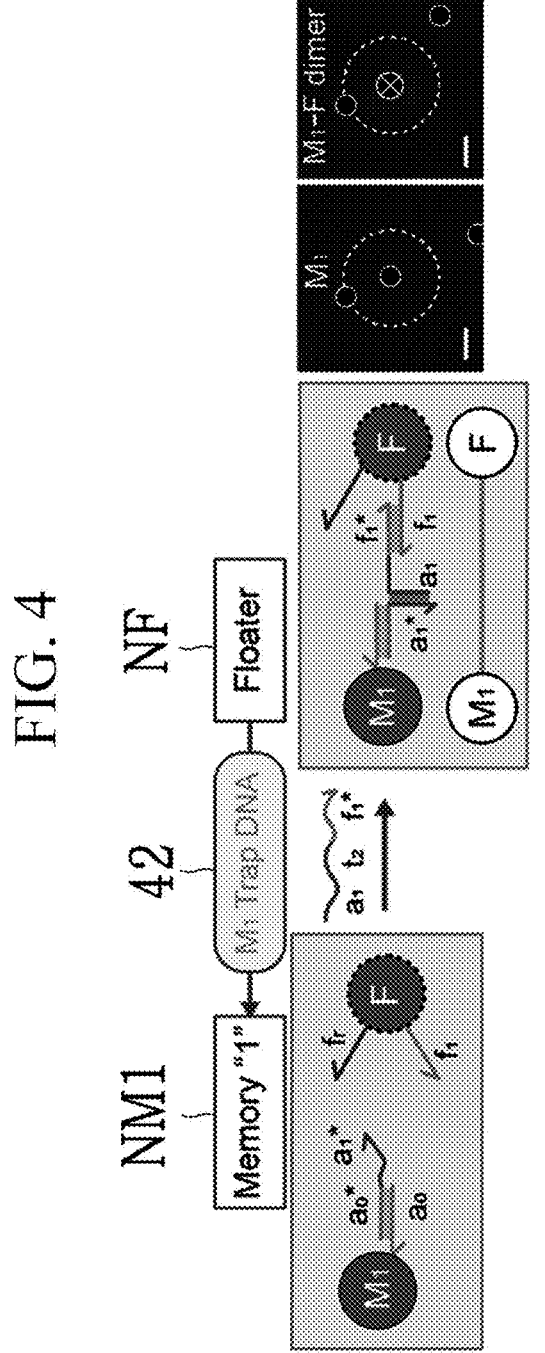
Figure 4:
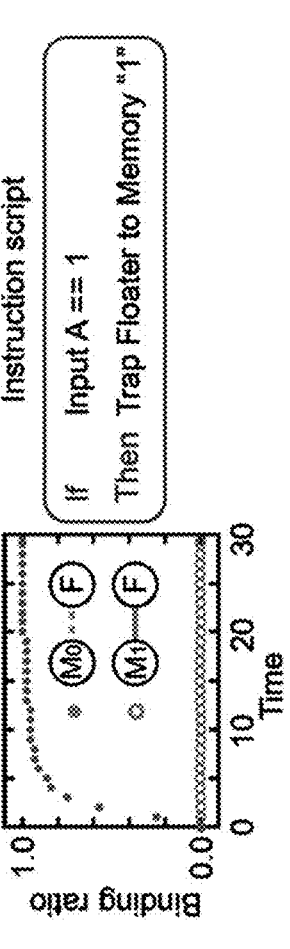
Figure 5:
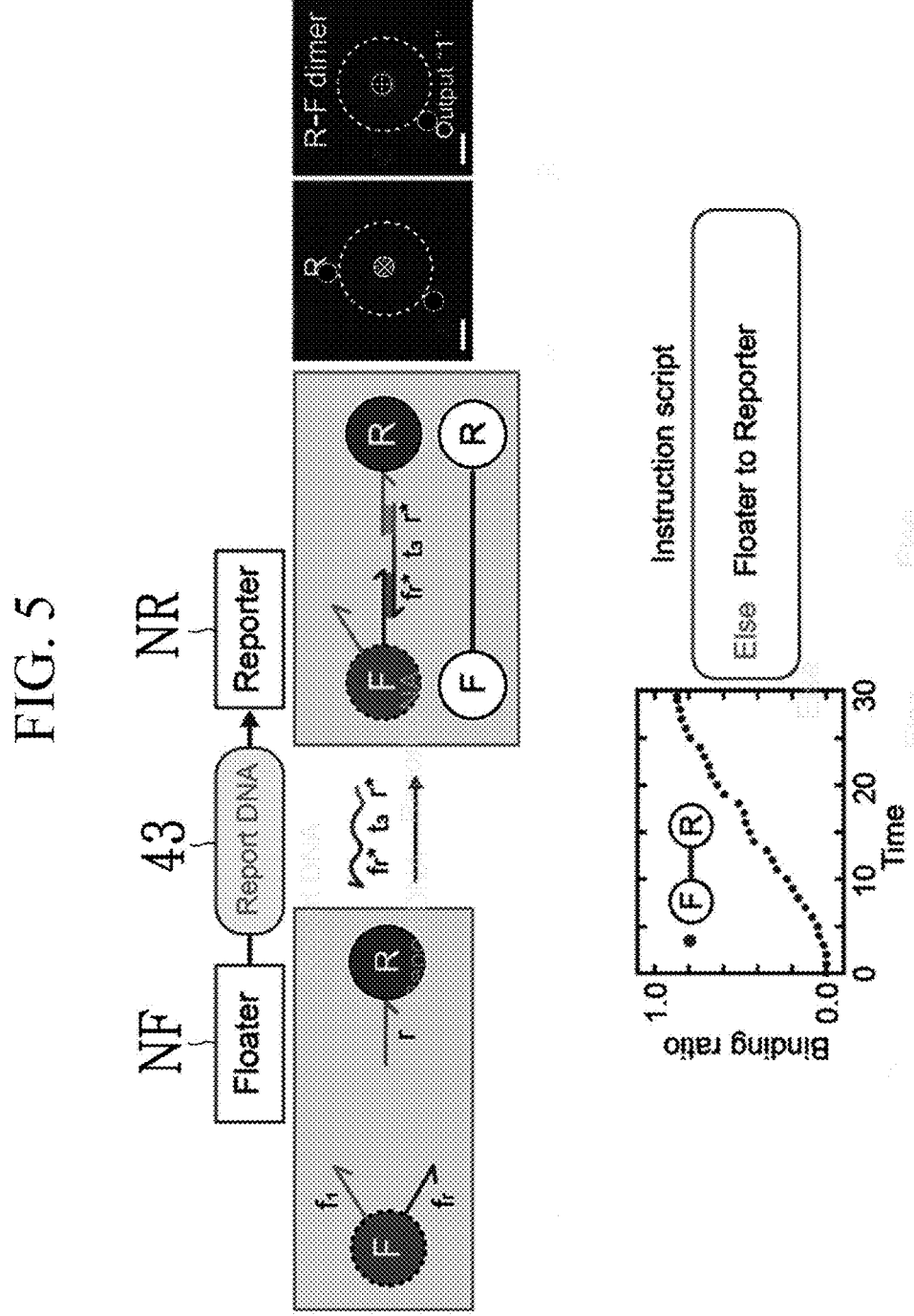

FIGS. 3 to 5 are diagrams illustrating reaction rates of three types of instruction DNA.

In FIGS. 3 to 5, a reaction rate of $NM_0$ trap DNA 41, an $NM_1$ trap DNA 42, and a report DNA 43 is illustrated.

A curve indicated with a black circle in the binding ratio/time graph of FIGS. 3 and 4 is referred. When the $NM_0$ trap DNA 41 and the $NM_1$ trap DNA 42 of 8 nM are added, times of the assembly of the half of NF to $NM_0$ and $NM_1$ are 3.6 minutes and 1.9 minutes. Hereinafter, unlike this, referring to the curve indicated with the circle in the binding ratio/time graph in FIGS. 3 and 4, the NF is not trapped or is slowly trapped to $NM_0$ by the $NM_1$ trap DNA 42, and is not trapped or is slowly trapped to $NM_1$ by the $NM_0$ trap DNA 41.

Referring to the curve indicated with the black circle in the binding ratio/time graph in FIG. 5, when the 1 nM report DNA 43 is added, the initial reaction within five minutes in which the NF is assembled to the NR is suppressed, but 90% or more of the NF is assembled to the NR after 30 minutes, and the time of the assembly of the half of NF to the NR is 17.7 minutes.

In the dark-field microscope imaging positioned at the centers of FIGS. 3 to 5, it can be seen that trapping or reporting in which the NF binds to the NM or the NR may be monitored by the change in color.

For example, FIG. 3 illustrates that NM $M_0$ with the scattering color of green (indicated by a circle) binds to the NF, so that the scattering color of the NM $M_0$ is changed to yellow (indicated by an X-patterned circle), and FIG. 4 illustrates that NM $M_1$ with the scattering color of green binds to the NF, so that the scattering color of the NM $M_1$ is changed to yellow. FIG. 5 illustrates that NR R with the scattering color of blue (indicated by a lattice-patterned circle) binds to the NF, so that the scattering color of the NR R is changed to green-blue (indicated by a +-patterned circle). In FIGS. 3 and 4, the fast trapping of the NF to the NM may be expressed with the instruction of an If-Then statement, and in FIG. 5, the reporting of the slow assembly of the NF to the NR may be expressed with an Else statement.

Figure 6:
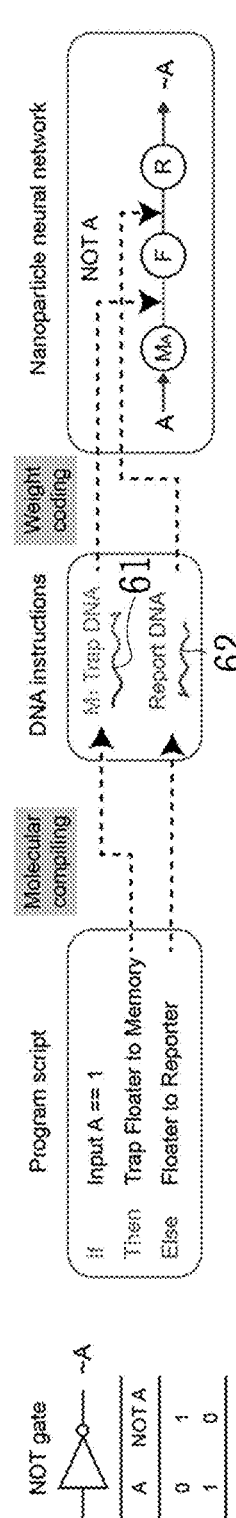
FIG. 6 illustrates a NOT gate programmed with a combination of instruction DNAs coding a nanoparticle neural network.

FIG. 6 illustrates a NOT gate programmed with a combination of instruction DNAs coding a nanoparticle neural network.

As illustrated in FIG. 6, when an input A is 0, the NOT gate generates 1 as an output (NOT A), and when the input A is 1, the NOT gate generates 0 as an output (NOT A).

The NOT gate function may be expressed with an If-Then-Else program script, and may be directly converted to the molecular instruction DNA code composed of the trap DNAs and the report DNAs.

For example, (if) if the input A is 1, (Then) the NF is trapped to the NM, and (Else) if the input A is not 1, the NF is assembled to the NR. When molecular compiling is performed, an $M_1$ trap DNA 61 and a report DNA 62 that is the instruction DNAs are determined, and a combination of instruction DNAs that code the nanoparticle neural network is determined through weight coding.

As illustrated at the rightmost side of FIG. 6, in an operation of the NOT gate, the NF F is trapped to the NM MA by the $M_1$ trap DNA 61 according to the input A binding to the NM MA, or the NF F is assembled to the NR R by the report DNA 62, so that the output ~A is output.

Figure 7:
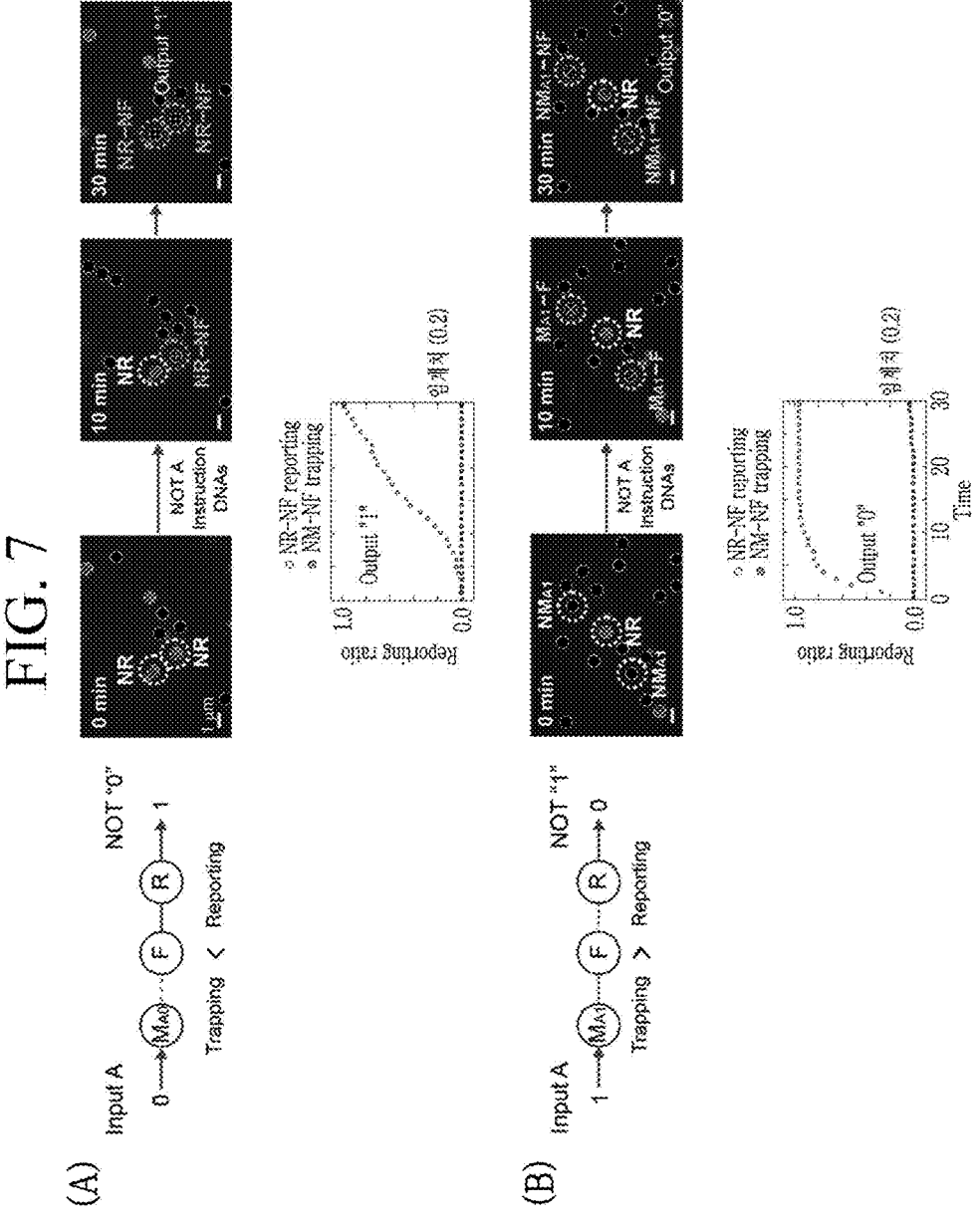
FIG. 7 is a diagram illustrating an operation of the NOT gate in a Lipid NanoTablet (LNT).

FIG. 7 is a diagram illustrating an operation of the NOT gate in a Lipid NanoTablet (LNT).

As illustrated in A of FIG. 7, when the input A is 0, the NF F is assembled to the NR R without a specific interaction with the NM $MA_0$ to generate the NF-NR assembly (Trapping<Reporting).

As monitored with the dark-field microscope, when the input A is 0, two NRs with the scattering color of green are indicated with the dotted circle at 0 minute. It can be seen that when the combination of instruction DNAs programmed with "NOT A" is added, the reporting occurs more than trapping, so that the NR and the NF are assembled (NR-NF) by the report DNA that is one of the instruction DNAs and the scattering color of green-blue is observed after 10 minutes, and the occurrence of the NR-NF assembly increases after 30 minutes. Then, a reporting rate monitored with the scattering color of green-blue by the dark-field microscope is larger than a predetermined threshold of 0.2, so that the output is determined to 1.

When the input A is 1, one NR with the scattering color of blue and two green $NM_{A1}$ are indicated by a dotted circle at 0 minute. In the case where the input A is 1, when the combination of instruction DNAs programmed with "NOT A" is added, the trapping occurs more than the reporting (Trapping>Reporting), the $NM_{A1}$ binds to the NF (MA1-NF) by the $M_1$ trap DNA that is one of the instruction DNAs, so that two scattering color of yellow are observed after 10 minutes. Then, the reporting rate monitored with the scattering color of yellow by the dark-field microscope almost reaches 1, and the reporting rate monitored with the scattering color of green-blue is close to 0 that is smaller than the threshold of 0.2, so that the output is determined to 0.

Figure 8:
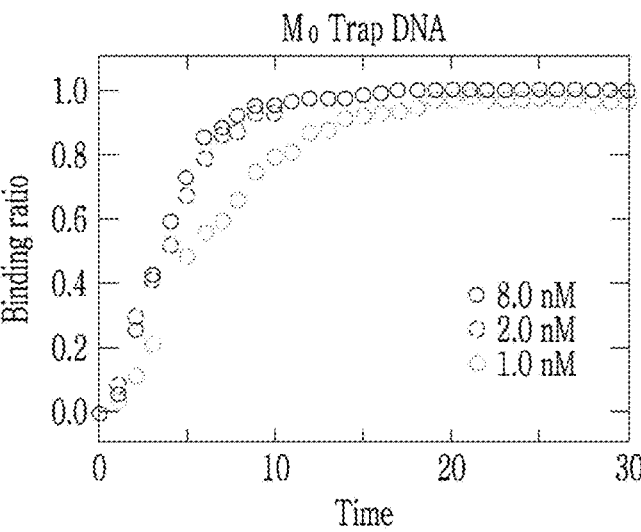
FIGS. 8 to 10 are graphs representing reaction kinetics between nanoparticles for each instruction DNA.
Figure 9:
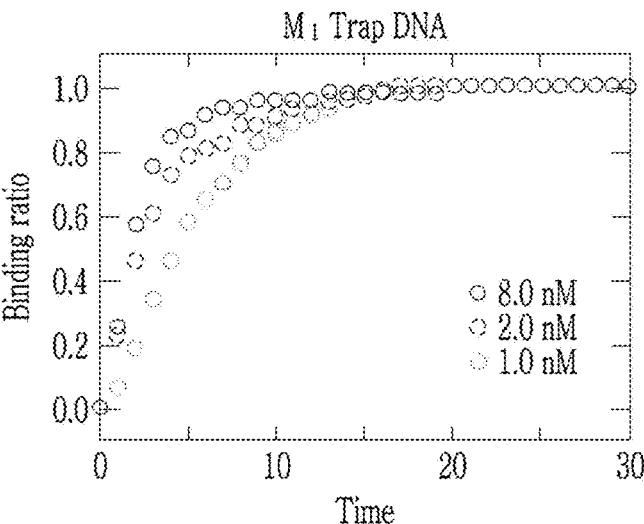
Figure 10:
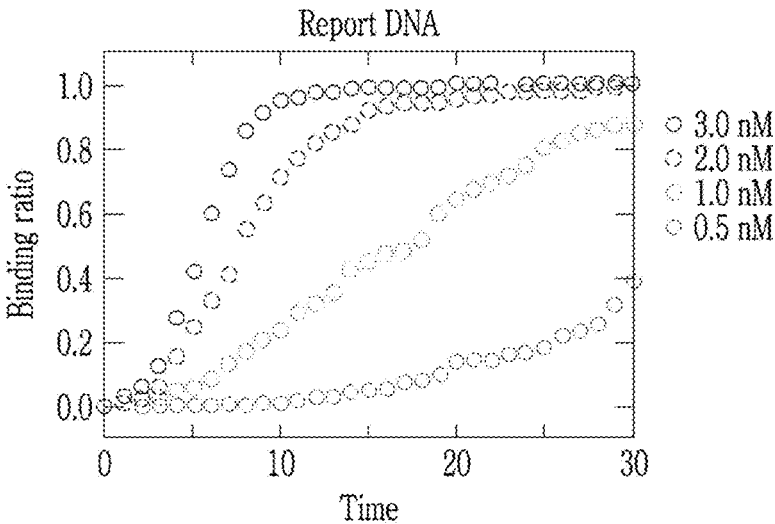

FIGS. 8 to 10 are graphs representing reaction kinetics between nanoparticles for each instruction DNA.

FIG. 11 is a diagram illustrating a half assemble period and an initial ratio constant that are kinetics data.

Figure 12:
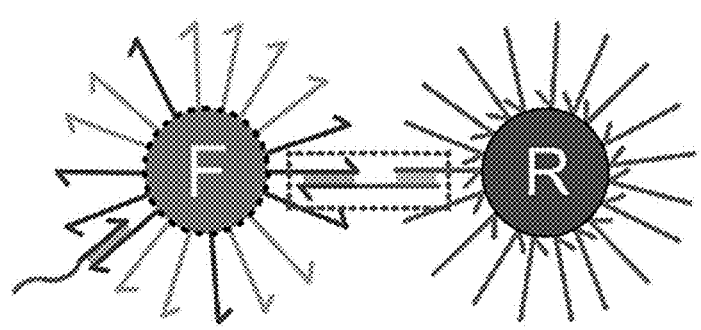
FIG. 12 is a diagram illustrating a reaction between a report DNA and an NF over time.
Figure 12:
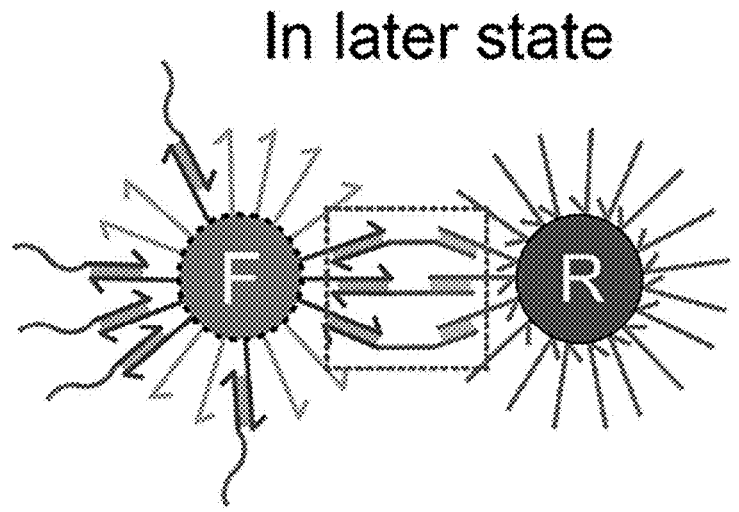

FIG. 12 is a diagram illustrating a reaction between a report DNA and an NF over time.

In the NVNA-LNT, the program, that is, the set of instructions for the logic circuit, may be composed of a combination of the plurality of trap DNAs and report DNAs.

In order to enable the nanoparticle to make a logical decision, the exemplary embodiment of the present invention uses two types of $NM_0$ trap DNA 41 and the $NM_1$ trap DNA 42 in order to bind the NF to each of the $NM_0$ and the $NM_1$. However, the invention is not limited thereto.

The hybridization domains in the Trap DNA ($a_{0s}$, $a_1$, and $f_1$) are 14 nucleotides whose melting temperatures are higher than 40° C., allowing fast trapping. On the other hand, another type of instruction DNA, namely the report DNA, is designed to make the NFs be assembled to the NR much more slowly than the logic-allowed trapping for difference in binding kinetics. As illustrated in FIGS. 8 and 9, to ensure faster trapping kinetics compared to the assembling to the NR, in the exemplary embodiment, the NM density (0.1 to 0.2 $m^{-2}$) at 8-nM concentration higher than the density (~0.02 $m^{-2}$) of the NR by 5 to 10 times is used. Then, 80% of the NF is trapped to the NM within 10 minutes, which is close to the diffusion-controlled reaction.

For the report DNA, in the exemplary embodiment, domain r*, which has an 8-base sequence and has a lower melting temperature of about 16° C., is used. In this case, as illustrated in FIG. 12, multivalent links in the report DNA between the NF and NR are required for stable assembly of the NF and the NR. As illustrated in FIG. 11, when 1-nM report DNA is added, the initial binding of the NF to the NR is suppressed with a lag time of about 5 minutes. After 5 minutes, the binding kinetics become faster as multiple report DNA strands start bindings to the NF as represented by an increasing slope over time. The initial reporting kinetics are slow, but when the report DNA is used, 85% or more of the NFs may be assembled to the NR within 30 minutes.

For all nanoparticle reactions, detailed experimental conditions (reaction time, DNA concentrations, and buffer conditions), DNA design (domain length, sequence), and kinetics data ($\tau$ ½, $k_i$) will be described below.

In FIG. 11, the half assemble period $\tau$½ is the time taken for the half of the NFs to bind to the NM by each trap DNA, and the initial rate constant $k_i$ may be calculated as the binding rate/time as the factor representing a reaction rate at the start of the binding reaction. The kinetics data of FIG. 11 is the result of the analysis under the fixed nanoparticle density and instruction DNA concentration.

As illustrated in FIG. 11, as the concentration of trap DNA increases, the half assembly period generally decreases and the initial rate constant increases.

As illustrated in FIGS. 8 and 9, the $M_0$ trap DNA and the $M_1$ trap DNA exhibit a saturation behavior at a constant ratio at a high concentration, and exhibits the diffusion-controlled reaction in which the assemble reaction more depends on the diffusion of the NF to the NM, than the recruitment of the instruction DNA.

Further, the $M_1$ trap DNA shows faster kinetics than the $M_0$ trap DNA, which is because the a1 domain strands having the low DNA density (low electrostatic repulsion) are exposed over the outer spherical shell of the DNA on the nanoparticle NM $M_1$.

Like the upper drawing of FIG. 12, the report DNA shows the suppressed reaction in the early state (shorter than 3 minutes), and the reaction rate of the report DNA is much slower than the reaction rate of the trap DNA due to the short binding domain r*(8 nt) (the temperature is lower than 20° C.). In comparing with the trap DNA having the 14-mer hybridization domain, the report DNA requires multivalent DNA interaction, such as "In Later State" in order for the NF to be stably assembled to the NR. The NF shows the temporal and dynamic assembly and disassembly event in the early state, so that a false signal of an early report may be generated. The report DNA according to the exemplary embodiment is assembled with the NF through the multivalent DNA interaction, to decrease the false signal of the early report and provide better computing performance.

Referring back to FIGS. 3 to 5, the competitive trapping and reporting operation using the difference of the binding rate may be expressed with the If-Then-Else statement. The If-Then-Else statement first searches whether the If condition satisfies TRUE or FALSE, and then operates a Then or Else statement. The initial search for the If-Then statement is similar to the function of the trap DNA that consumes the NF at a higher rate, and the Else statement may be represented with the function of the report DNA that outputs the output "1" according to the conditional trapping result.

When a mixture of the trap DNA and the report DNA is introduced into the NVNA-LNT chip, the NF binding generates a different result according to the NM storage state and the logical operation and implement the logic operation. In case of the output "0", the NM particle serves as the kinetic trap consuming all of the NFs, so that the NF cannot bind to the NR, resulting in outputting the output "0". When the result of the logic operation for the NM in which the input is stored is TRUE, the NF is assembled to the NR, and a distinct Plasmon bond is created between the green scattering gold nanoparticle NF and the glue scattering silver nanoparticle NR and the output "1" is output.

As illustrated in FIG. 6, for example, the NOT logic gate may be implemented in the form of a molecular state by using the mixture of the $NM_1$ trap DNA and the report DNA. The function of the NOT logic gate may be expressed with the script of If (A==1) Then (Trap NF to NM) Else (Report NF to NR) by using the If-Then-Else statement.

The If-Then statement of the corresponding script is substituted to the function of the $M_1$ trap DNA 61 identically to the method illustrated in FIG. 4, and the Else statement of the corresponding script is substituted to the function of the report DNA 62 identically to the method illustrated in FIG. 5. Then, the function of the NOT logic gate may be translated to the molecular state that is the mixture of the $M_1$ trap DNA 1 and the report DNA 62 (molecular compiling). The translated molecules are the DNA instructions and serve as software, and the mixture in which weight for each DNA instruction is coded is input to the NVNA-LNT chip implementing the nanoparticle neural network. Then, the NVNA-LNT chip recognizes the input and performs the NOT function. As described above, when a program is actually written in a computer, a process of writing a functional code by using a program language, compiling the functional code, and translating the compiled code into a machine language understandable by the computer is applicable to the nano computing device according to the exemplary embodiment.

As illustrated in FIG. 7, when the NM state is "0", the NF binds only to the NR and the output "1" is output. In contrast to this, when the NM state is "1", all of the NFs are trapped to the $NM_1$ through the $NM_1$ trap DNA, so that the output "1" is output. In order to analyze the output "1" and the output "0", the reporting ratio ((Reporting)/(Reporting+ Trapping)) may be quantitatively measured.

Figure 13:
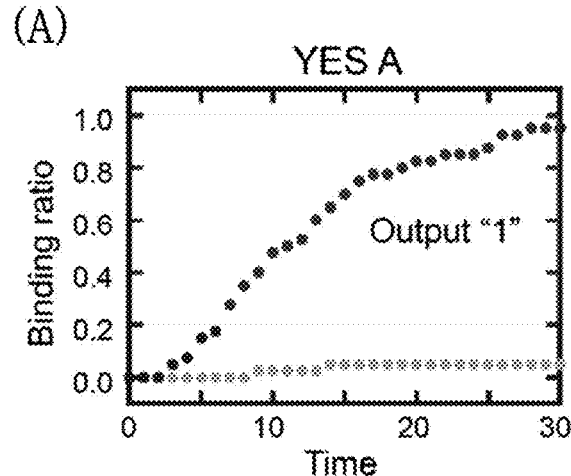
FIG. 13 is a graph representing a binding ratio in an operation 12 hours after storage of YES A and NOT A data.
Figure 13:
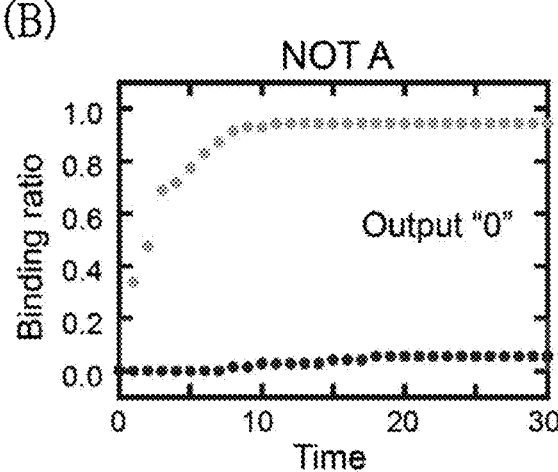

FIG. 13 is a graph representing a binding ratio in an operation 12 hours after storage of YES A and NOT A data.

After the input DNA is stored in the NM, the chamber was washed with 1×PBS, and cultured for 12 hours at 25° C. In FIG. 13, the distinct output having the low leakage reaction represents that the input DNA is stably stored in the NM in the state "1". That is, there is only negligible dehybridization, but the DNA is stably stored in the NM in the state "1". The 23-mer hybridization domain for the storage may guarantee high hybridization affinity (Tm>55° C.) with the DNA in the nanoparticle.

As illustrated in FIG. 13, since the input DNA attached to the NM remains thermodynamically stable on the surface of the NM particle even after 12 hours elapse, the stored NM state may be used even in an information processing operation after the input solution is washed from the LNT.

As described above, in the exemplary embodiment, the data storage operation and the information processing operation may be separated, so that it is possible to easily provide the logical function (for example, the NOT gate function). According to the exemplary embodiment, a predetermined logical gate may be executed without dual-rail transition logic disclosed in the lipid nanotablet (LNT) of Korean Patent Application No. 10-2018-0061345, so that the computing performance of the system may be improved without property reversal.

Together with the $NM_0$ trap DNA, the logically inhibited assembly may occur between the NF and the $NM_1$. Although the input DNA was designed to be trapped in the $a_0$ domain (24 nucleotides, see FIG. 3) of the NM at a sufficiently high melting temperature, multiple isolated and unbound $a_0$ domains may still be present in the $NM_1$ due to high local concentration and charge repulsion of the DNA near the nanoparticle surface. Leaky nonspecific trapping may occur for the kinetic reaction of the NF to the $NM_1$ due to the addition of the $NM_0$ trap DNA, but the leakage reaction is significantly slower than the report kinetics, so that the output signal "1" may always be reported. Further, there may be another false positive leak, in which the early report occurs before the trapping is completed. In order to decrease the leak, it is necessary to set a reference value having a critical meaning for the reporting ratio. For example, an experiment was conducted to clearly distinguish between false positive leak kinetics and true positive reaction kinetics within the first 5 minutes over 15 or more times. In consideration of the non-specific reaction as a whole, in the exemplary embodiment, when the reporting ratio exceeds 0.2, the output is set to "1", and when the reporting ratio is equal to or smaller than 0.2, the output is set to "0".

The reaction network between the plurality of nanoparticles connected by the instruction DNAs may be expressed as a perceptron that is a type of artificial neural network for a binary classifier. Accordingly, in the exemplary embodiment, the programming strategy for configuring the nanoparticle neural network NNN in the LNT platform may be expanded. In this case, the NM, the NF, and the NR may correspond to the input layer, the hidden layer, and the output layer, and the instruction DNA may correspond to the weight concept. The method of determining, by each floater, true or false according to the memory state is similar to the activation function of activating the hidden layer only when the sum of the cross product of the input and the weight (hereinafter, the weight input sum) exceeds a specific threshold. The quantitative value of the weight for the NNN is illustrated in FIG. 14.

Figure 14:
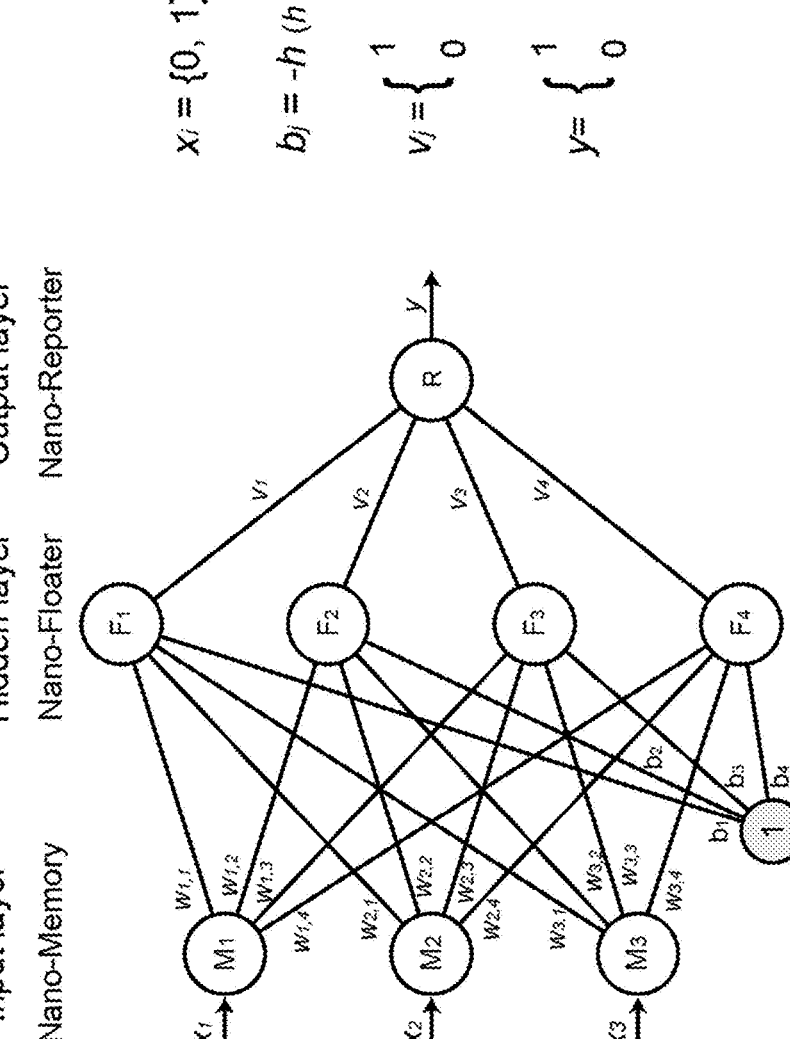
FIG. 14 is a diagram illustrating a Nanoparticle Neural Network (NNN) for a functionally complete 3-input system.

FIG. 14 is a diagram illustrating the NNN for a functionally complete 3-input system.

As illustrated in FIG. 14, the nanoparticle neural network system is illustrated as a multiple layer perceptron diagram, and the nanoparticle neural network includes an input layer (nano-memory), a hidden layer (nano-floater), and an output layer (nano-reporter), and $x_i$ is the input, the $w_{i,j \ and} v_i$ is the weight value, the y is the output (I=1 to 3, j=1 to 4).

The input layer includes three input nodes M1, M2, and M3, the hidden layer includes four hidden nodes F1, F2, F3, and F4, and the output layer includes one output node R. The NF calculates the weighted sum of inputs in which the weight is multiplied to the inputs and bias upon input condition and is activated with the activation function of the Heaviside step function. The $NM_0$ trap DNA inactivates the NF in the input "0" and the $NM_1$ trap DNA inactivates the NF in the input "1", so that the $NM_0$ trap DNA and the $NM_1$ trap DNA may be expressed with discrete weights of 1 and −1, respectively. In order to set the threshold for the activation function to 0, a bias is required to balance the positive and negative values of the sum of weighted inputs. The bias may be defined with the number of $NM_0$ trap DNAs. The activated NF may bind to the NR with the output "1".

The input $x_i$ is 0 or 1, and the weight value $w_{i,j}$ is 1, 0, or −1. The bias value bj is the number of $w_{i,j}$ having the weight of 1, and when the sum of the weight input sum $(\Sigma_{i=1}^{n} \text{Wij} \cdot X_i)$ and the bias vale bj is equal to or larger than 0, the weight $v_j$ between the hidden layer and the output layer is 1, and when the sum of the weight input sum $(\Sigma_{i=1}^{n} \text{Wij} \cdot X_i)$ and the bias vale bj is smaller than 0, the weight $v_j$ between the hidden layer and the output layer is 0. When the sum of weights $v_j$ is larger than 0, the output y is 1, and when the sum of weights $v_j$ is not larger than 0, the output y is 0.

Hereinafter, the 2-input Boolean logic gate programming and reset operation by using the nanoparticle neural network will be described.

Figure 15:
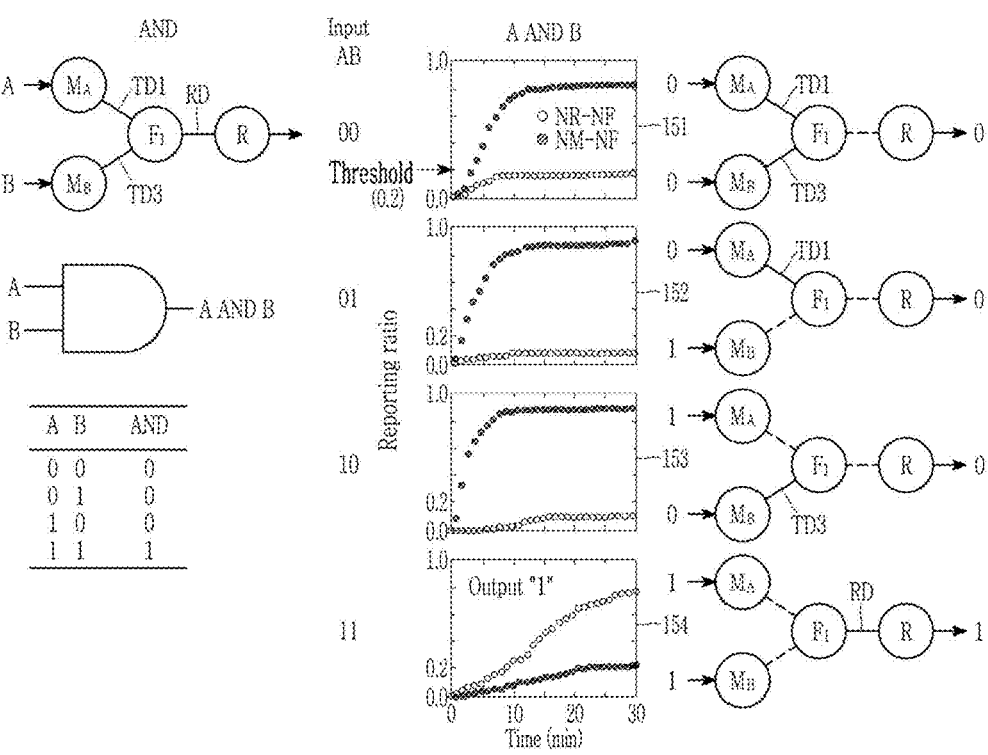
FIG. 15 is a diagram illustrating a single-layer perceptron for an AND logic gate.

FIG. 15 is a diagram illustrating a single-layer perception for an AND logic gate.

Figure 16:
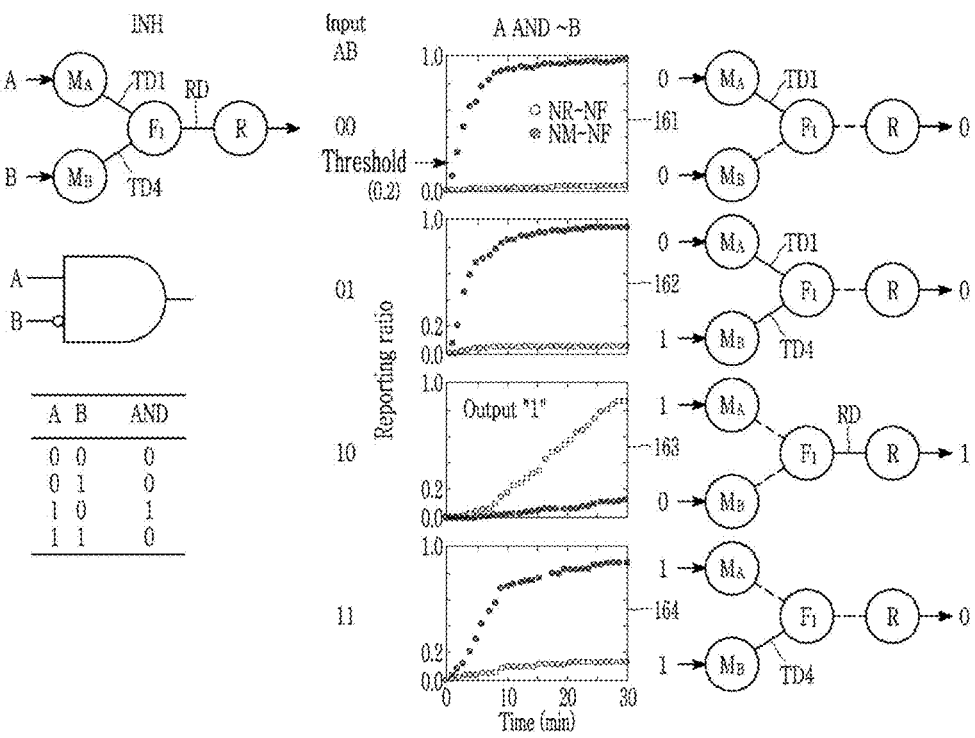
FIG. 16 is a diagram illustrating a single-layer perceptron for an INHIBIT logic gate.

FIG. 16 is a diagram illustrating single-layer perceptron for an INHIBIT logic gate.

Figure 17:
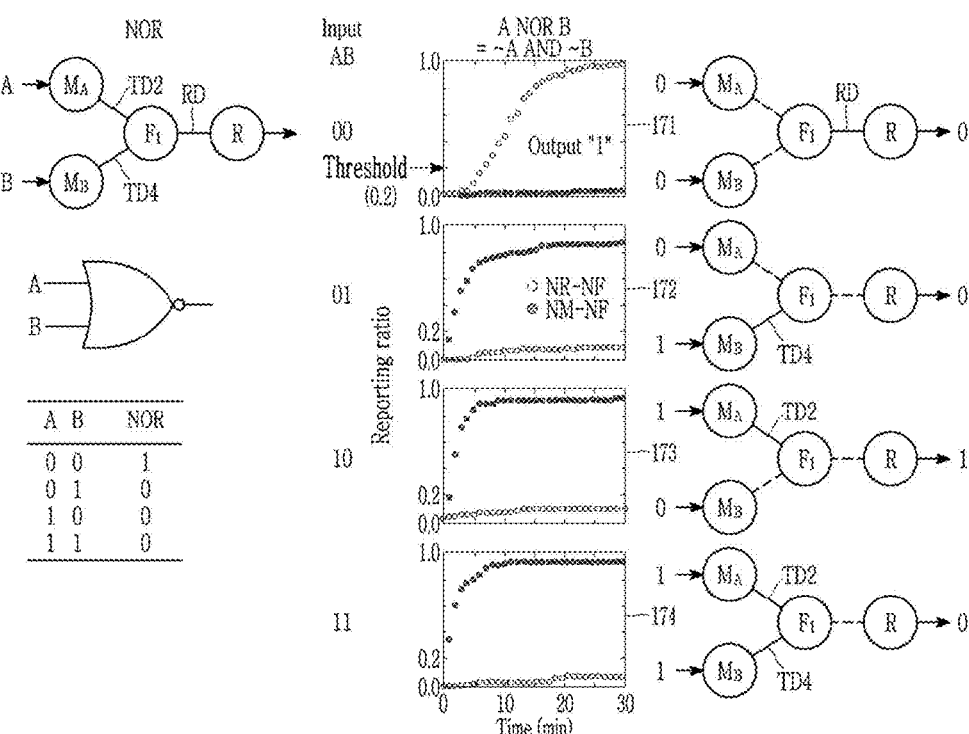
FIG. 17 is a diagram illustrating a single-layer perceptron for an NOR logic gate.

FIG. 17 is a diagram illustrating a single-layer perceptron for an NOR logic gate.

There are four input combinations 00, 01, 10, and 11 according to two inputs A and B, and each logic gate determines an output according to the input, and the outputs of the logic gates implemented with the single-layer perceptron of FIGS. 15 to 17 may be determined based on the threshold of 0.2 as represented in the reporting ratio graph.

In FIGS. 15 to 17, the trap DNA and the report DNA encode the weight between the nodes. The nanoparticle network in each of the four input combinations is indicated by a solid line and a dotted line. The solid line represents a nanoparticle assembly reaction, and the dotted line represents that there is no reaction or the reaction is suppressed. In the reporting ratio graph, the NF-NR binding is indicated with white points, and the NF-NM binding is indicated with black points.

In FIG. 15, the NF $F_1$ is trapped to the $NM_A$ MA by the $NM_0$ trap DNA TD1, is trapped to the $NM_B$ $M_B$ by the $NM_0$ trap DNA TD3, and is assembled to the NR R by the report DNA RD.

The AND logic gate illustrated in FIG. 15 is the gate performing the AND operation on two inputs A and B. The reporting ratio graphs 151 to 154 for the four input combinations 00, 01, 10, and 11 according to two inputs are illustrated in FIG. 15. As illustrated in the reporting ratio graphs 151 to 153 for the input combinations 00, 01, and 10, the trapping ratios are approximately 0.8 to 0.9, and the NFs are trapped to the $NM_A$ MA and/or the $NM_B$ $M_B$ by the $NM_0$ trap DNA TD1 and/or the $NM_0$ trap DNA TD3, so that the reporting ratio fails to reach 0.2, and the output is determined to 0. However, as illustrated in the reporting ratio graph 154 for the input combination 11, the reporting ratio is approximately 0.8 and the NFs are assembled to the NR R by the report DNA RD, so the reporting ratio exceeds the threshold of 0.2 and the output is determined to 1.

In FIG. 16, the NF $F_1$ is trapped to the $NM_A$ $M_A$ by the $NM_0$ trap DNA TD1, is trapped to the $NM_B$ $M_B$ by the $NM_1$ trap DNA TD4, and is assembled to the NR R by the report DNA RD.

The INHIBIT logic gate (hereinafter, the INH logic gate) illustrated in FIG. 16 is the gate performing the AND operation for the input A and the negative input B~B. The reporting ratio graphs 161 to 164 for the four input combinations 00, 01, 10, and 11 according to two inputs are illustrated in FIG. 16. As illustrated in the reporting ratio graphs 161, 162, and 164 for the input combinations 00, 01, and 11, the trapping ratios are approximately 0.8 to 1, and the NFs are trapped to the $NM_A$ $M_A$ and/or the $NM_B$ $M_B$ by the $NM_0$ trap DNA TD1 and/or the $NM_0$ trap DNA TD4, so that the reporting ratio fails to reach 0.2, and the output is determined to 0. However, as illustrated in the reporting ratio graph 163 for the input combination 10, the reporting ratio is 0.8 or more and the NFs are assembled to the NR R by the report DNA RD, so the reporting ratio exceeds the threshold of 0.2 and the output is determined to 1.

In FIG. 17, the NF $F_1$ is trapped to the $NM_A$ $M_A$ by the $NM_1$ trap DNA TD2, is trapped to the $NM_B$ $M_B$ by the $NM_1$ trap DNA TD4, and is assembled to the NR R by the report DNA RD.

The NOR logic gate illustrated in FIG. 17 is the gate that logically negates the result of the OR operation for inputs A and B. The reporting ratio graphs 171 to 174 for the four input combinations 00, 01, 10, and 11 according to two inputs are illustrated in FIG. 17. As illustrated in the reporting ratio graphs 172 to 174 for the input combinations 01, 10, and 11, the trapping ratios are approximately 0.9 to 1, and the NFs are trapped to the $NM_A$ $M_A$ and/or the $NM_B$ $M_B$ by the $NM_1$ trap DNA TD2 and/or the $NM_1$ trap DNA TD4, so that the reporting ratio fails to reach 0.2, and the output is determined to 0. However, as illustrated in the reporting ratio graph 171 for the input combination 00, the reporting ratio is approximately 1 and the NFs are assembled to the NR R by the report DNA RD, so the reporting ratio exceeds the threshold of 0.2 and the output is determined to 1.

Figure 18:
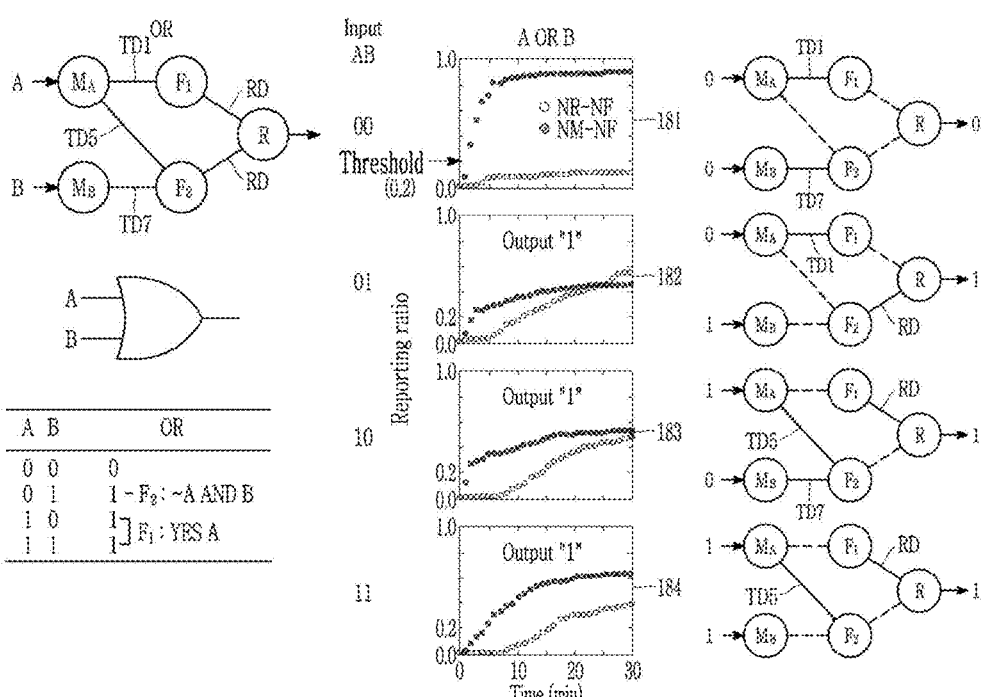
FIG. 18 is a diagram illustrating a multilayer perceptron for an OR logic gate.

FIG. 18 is a diagram illustrating a multilayer perceptron for an OR logic gate.

Figure 19:
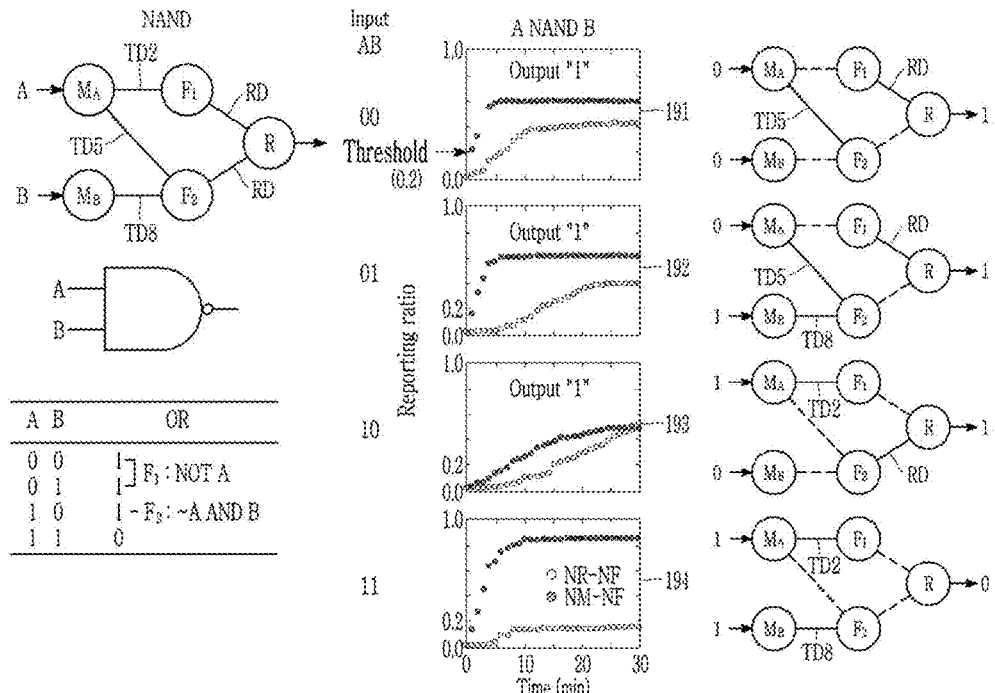
FIG. 19 is a diagram illustrating a multilayer perceptron for an NAND logic gate.

FIG. 19 is a diagram illustrating a multilayer perceptron for an NAND logic gate.

Figure 20:
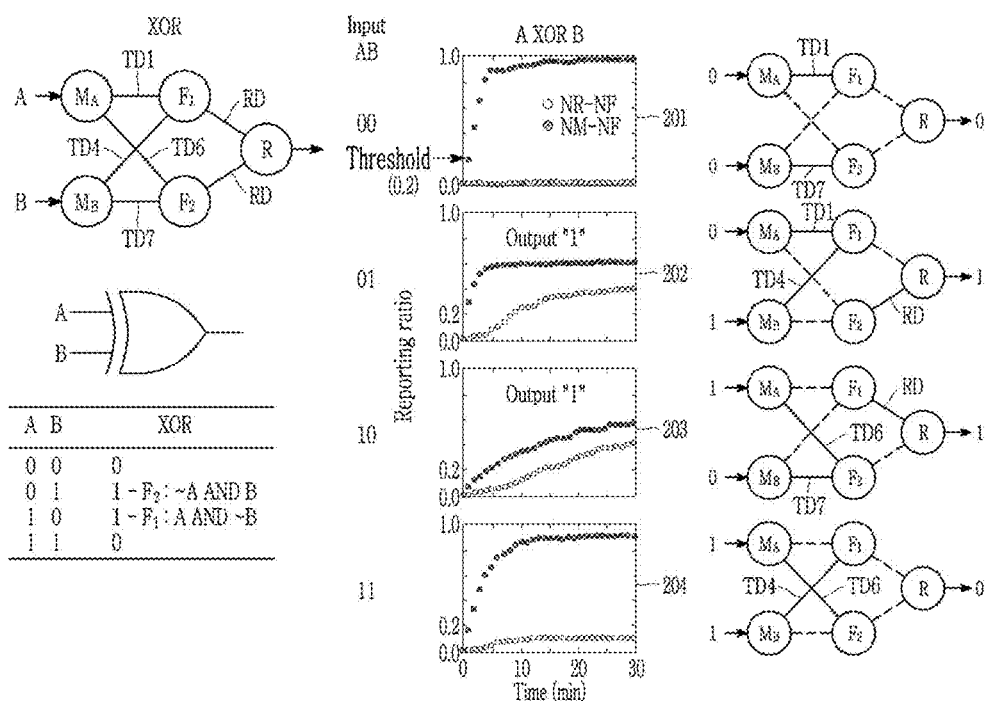
FIG. 20 is a diagram illustrating a multilayer perceptron for an XOR logic gate.

FIG. 20 is a diagram illustrating a multilayer perceptron for an XOR logic gate.

Figure 21:
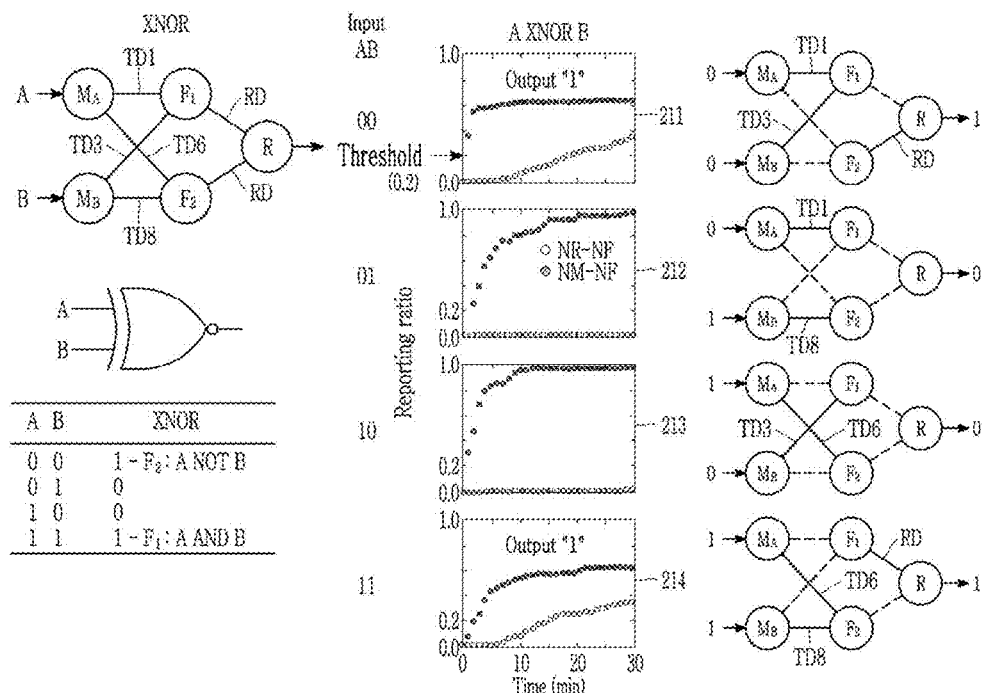

FIG. 21 is a diagram illustrating a multilayer perceptron for an XNOR logic gate.

There are four input combinations 00, 01, 10, and 11 according to two inputs A and B, and each logic gate determines the output according to the input, and FIGS. 18 to 21 illustrate the logic gates implemented with the multilayer perceptron having two different NFs. The outputs of the corresponding logic gates may be determined based on the threshold of 0.2 as represented in the reporting ratio graph. However, in the logic gates implemented with the multilayer perceptron, one of the two NFs is assembled to the NR, so that output is represented as 1, so that the reporting ratio of the NR-NF binding may not exceed 0.5.

In FIGS. 18 to 21, the trap DNA and the report DNA encode the weight between the nodes. The nanoparticle network in each of the four input combinations is indicated by a solid line and a dotted line. The solid line represents a nanoparticle assembly reaction, and the dotted line represents that there is no reaction or the reaction is suppressed. In the reporting ratio graph, the NF-NR binding is indicated with white points, and the NF-NM binding is indicated with black points.

In FIG. 18, the NF $F_1$ is trapped to the $NM_A$ $M_A$ by the $NM_0$ trap DNA TD1, and is assembled to the NR R by the report DNA RD. The NF $F_2$ is trapped to the $NM_B$ $M_B$ by the $NM_0$ trap DNA TD7, is trapped to the $NM_A$ $M_A$ by the $NM_1$ trap DNA TD5, and is assembled to the NR R by the report DNA RD.

The OR gate illustrated in FIG. 18 is the gate performing the OR operation on two inputs A and B. In order to implement the OR gate, in the input combination 01, the NF $F_2$ is assembled to the NR R in order to indicate the output according to the logic multiplication of the negative input A~A and the input B, and in the input combinations 10 and 11, the NF $F_1$ is assembled to the NR R in order to indicate the output according to the YES logic for the input A.

The reporting ratio graphs 181 to 184 for the four input combinations 00, 01, 10, and 11 according to two inputs are illustrated in FIG. 18. As illustrated in the reporting ratio graphs 182 to 184 for the input combinations 01, 10, and 11, the reporting ratios are approximately 0.4 to 0.5 and the NFs are assembled to the NR R by the report DNA RD, so the reporting ratio exceeds the threshold of 0.2 and the output is determined to 1. Referring to the reporting ratio graph 181 for the input combination 00, the trapping ratio is approximately 0.95, and the NFs are trapped to any one of the $NM_A$ and $NM_B$ by the $NM_0$ trap DNA TD1 or the $NM_0$ trap DNA TD7, and referring to the reporting ratio graphs 182 to 184 for the input combinations 01, 10, and 11, the trapping ratios are approximately 0.4 to 0.6 and the NFs are trapped to the $NM_A$ $M_A$ by the $NM_0$ trap DNA TD1, trapped to the $NM_A$ $M_A$ and the $NM_B$ $M_B$ by the $NM_0$ trap DNA TD7 and the $NM_1$ trap DNA TD5, or trapped to the $NM_A$ $M_A$ by the $NM_1$ trap DNA TD5.

In FIG. 19, the NF $F_1$ is trapped to the $NM_A$ $M_A$ by the $NM_1$ trap DNA TD2, and is assembled to the NR R by the report DNA RD. The NF $F_2$ is trapped to the $NM_B$ $M_B$ by the $NM_1$ trap DNA TD8, is trapped to the $NM_A$ $M_A$ by the $NM_0$ trap DNA TD5, and is assembled to the NR R by the report DNA RD.

The NAND gate illustrated in FIG. 19 is the gate that logically negates the result of the AND operation on two inputs A and B. In order to implement the NAND gate, in the input combinations 00 and 01, the NF $F_1$ is assembled to the NR R in order to indicate the output according to the negative input A~A and in the input combination 10, the NF $F_2$ is assembled to the NR R in order to indicate the output according to the logical multiplication of the negative input A~A and the input B.

The reporting ratio graphs 191 to 194 for the four input combinations 00, 01, 10, and 11 according to two inputs are illustrated in FIG. 19. As illustrated in the reporting ratio graphs 191 to 193 for the input combinations 00, 01, and 10, the reporting ratios are approximately 0.4 to 0.5, and the NFs are assembled to the NR R by the report DNA RD, so the reporting ratio exceeds the threshold of 0.2 and the output is determined to 1. Referring to the reporting ratio graph 194 for the input combination 01, the trapping ratio is approximately 0.9, and the NFs are trapped to any one of the $NM_A$ $M_A$ and $NM_B$ $M_B$ by the $NM_1$ trap DNA TD2 or the $NM_1$ trap DNA TD8, and referring to the reporting ratio graphs 191 to 193 for the input combinations 00, 01, and 10, the trapping ratios are approximately 0.4 to 0.5, and the NFs are trapped to the $NM_A$ $M_A$ by the $NM_0$ trap DNA TD5, or trapped to the $NM_A$ $M_A$ or the $NM_B$ $M_B$ by the $NM_1$ trap DNA TD2 and the $NM_1$ trap DNA TD8.

In FIG. 20, the NF $F_1$ is trapped to the $NM_A$ $M_A$ by the $NM_0$ trap DNA TD1, is trapped to the $NM_B$ $M_B$ by the $NM_1$ trap DNA TD4, and is assembled to the NR R by the report DNA RD. The NF $F_2$ is trapped to the $NM_B$ $M_B$ by the $NM_0$ trap DNA TD7, is trapped to the $NM_A$ $M_A$ by the $NM_1$ trap DNA TD6, and is assembled to the NR R by the report DNA RD.

The XOR gate illustrated in FIG. 20 outputs logic "0" when the two inputs A and B are the same as each other, and outputs logic "1" when the two inputs A and B are different from each other. In order to implement the XOR gate, in the input combination 01, the NF $F_2$ is assembled to the NR R in order to indicate the output according to the logic multiplication of the negative input A~A and the input B, and in the input combination 10, the NF $F_1$ is assembled to the NR R in order to indicate the output according to the logic multiplication of the input A and the negative input B~B.

The reporting ratio graphs 201 to 204 for the four input combinations 00, 01, 10, and 11 according to two inputs are illustrated in FIG. 20. As illustrated in the reporting ratio graphs 202 ad 203 for the input combinations 01 and 10, the reporting ratios are approximately 0.4, and the NFs are assembled to the NR R by the report DNA RD, so the reporting ratio exceeds the threshold of 0.2 and the output is determined to 1. Referring to the reporting ratio graph 201 for the input combination 00, the trapping ratio is approximately 1, and the NF is trapped to the $NM_A$ $M_A$ or the $NM_B$ $M_B$ by the $NM_0$ trap DNA TD1 or the $NM_0$ trap DNA TD7, and referring to the reporting ratio graph 204 for the input combination 11, the trapping ratio is approximately 0.9, and the NFs are trapped to any one of $NM_A$ $M_A$ and the $NM_B$ $M_B$ by the $NM_1$ trap DNA TD6 or the $NM_1$ trap DNA TD4. Referring to the reporting ratio graph 202 for the input combination 01, the trapping ratio is approximately 0.6, and the NFs $F_1$ are trapped to the $NM_A$ $M_A$ and the $NM_B$ $M_B$ by the $NM_0$ trap DNA TD1 and the $NM_1$ trap DNA TD4. Referring to the reporting ratio graph 203 for the input combination 10, the trapping ratio is approximately 0.6, and the NFs $F_2$ are trapped to the $NM_A$ $M_A$ and the $NM_B$ $M_B$ by the $NM_1$ trap DNA TD6 or the $NM_0$ trap DNA TD7.

In FIG. 21, the NF $F_1$ is trapped to the $NM_A$ $M_A$ by the $NM_0$ trap DNA TD1, is trapped to the $NM_B$ $M_B$ by the $NM_0$ trap NDA TD3, and is assembled with the NR R by the report DNA RD. The NF $F_2$ is trapped to the $NM_B$ $M_B$ by the $NM_1$ trap DNA TDB, is trapped to the $NM_A$ $M_A$ by the $NM_1$ trap DNA TD6, and is assembled to the NR R by the report DNA RD.

The XNOR gate illustrated in FIG. 21 outputs logic "1" when the two inputs A and B are the same as each other, and outputs logic "0" when the two inputs A and B are different from each other. In order to implement the XNOR gate, in the input combination 00, the NF $F_2$ is assembled to the NR R in order to indicate the output according to the NOR operation of the input A and the input B, and in the input combination 11, the NF $F_1$ is assembled to the NR R in order to indicate the output according to the logic multiplication of the input A and the input B.

The reporting ratio graphs 211 to 214 for the four input combinations 00, 01, 10, and 11 according to two inputs are illustrated in FIG. 21. As illustrated in the reporting ratio graphs 211 and 214 for the input combinations 00 and 11, the reporting ratios are approximately 0.4, and the NFs are assembled to the NR R by the report DNA RD, so the reporting ratio exceeds the threshold of 0.2 and the output is determined to 1. Referring to the reporting ratio graph 212 for the input combination 01, approximately the entire NFs are trapped to the $NM_A$ $M_A$ or the $NM_B$ $M_B$ by the $NM_0$ trap DNA TD1 or the $NM_1$ trap DNA TD8, and referring to the reporting ratio graph 213 for the input combination 10, the trapping ratio is approximately 1, and the NFs are trapped to the $NM_A$ $M_A$ or the $NM_B$ $M_B$ by the $NM_1$ trap DNA TD6 or the $NM_0$ trap DNA TD3. Referring to the reporting ratio graph 211 for the input combination 00, the trapping ratio is approximately 0.6, and the NFs $F_1$ are trapped to the $NM_A$ $M_A$ and the $NM_B$ $M_B$ by the $NM_0$ trap DNA TD1 and the $NM_0$ trap DNA TD3. Referring to the reporting ratio graph 214 for the input combination 11, the trapping ratio is approximately 0.6, and the NFs $F_2$ are trapped to the $NM_A$ $M_A$ and the $NM_B$ $M_B$ by the $NM_1$ trap DNA TD6 or the $NM_1$ trap DNA TD8.

Figure 22:
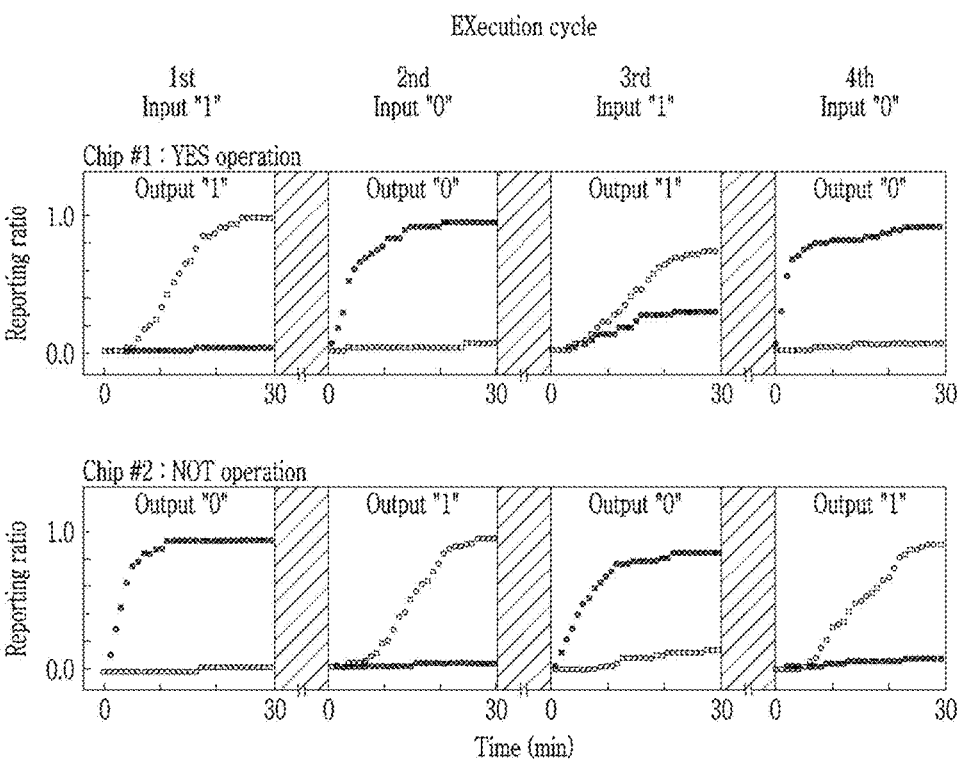
FIG. 22 is a diagram illustrating multi-execution of a logic gate in a single chip by resetting after each execution.

FIG. 22 is a diagram illustrating multi-execution of a logic gate in a single chip by resetting after each execution.

Hardware relaying on the covalently bonded nanostructure on a lipid chip allows for multiple executions by returning back to the initial state by the reset function for reuse. The hatched section illustrated in FIG. 22 is an initialization period, and all of the DNA assemblies may be dehybridized by exchanging the solution with a 5 mM phosphate buffer solution at 50° C. for 30 minutes. That is, all of the input DNAs and the instruction DNAs are detached by the dehybridization, and the LNT chip is reset to the initial state.

The melting temperature of the DNA domain is considerably lower than the melting temperature under the reset condition, so that the inputs stored in almost all of the instruction DNAs and NMs added to the logic operation may be detached at the low salt concentration and high temperature as described above. After the reset, only the thiolated DNAs remain on the nanoparticles, and the LNT returns to the initial state for the data storage and the logic operation.

As can be seen in the reporting ratio graph illustrated in FIG. 22, after the reset, the output is accurately represented according to the subsequent data storage and logic operation (for example, YES operation and NOT operation). Two chips performing the YES and NOT gate operations as well as data storage were tested, which shows reusability up to four times for the LNT chip.

As described above, it is possible to implement arbitrary Boolean logic circuits in a scalable and modular manner by using the NNN. The software programming function represented in Table 1 below may be provided by executing the functionally complete Boolean logic set for two-bit inputs. Table 1 represents an output of each logic operation according to the trap DNAs TD1 to TD8 and the report DNA RD. In Table 1, "1" represents the insertion of the corresponding trap DNA to the LNG chip, and "0" represents that the corresponding trap DNA is not inserted into the LNT chip. "0/1" represents that the output is determined regardless of the insertion of the DNA RD.

ences between the two NFs, a reporting ratio from 0.2 to 0.6 may represent the output "1," which indicates a significant difference between "TRUE" and "FALSE".

The number of nanoparticle nodes required for functional completeness of the Boolean logic operators may be calculated by the method described below.

For example, logic circuits dealing with n-bit inputs have $2^n$ input combinations, each of which may have an output of TRUE or FALSE. Thus, the possible number of logic circuits is $2^{2^n}$. Using the Karnaugh map, which simplifies Boolean algebra expressions, any n-bit logic circuit may be simplified into OR wiring of $2^{n-1}$ AND gates, each of which may be represented with one NF. Therefore, $2^{n-1}$ NFs are required to operate arbitrary n-bit logic circuits on the LNT. For example, to form a functionally complete set of all 256 ($=2^{2^3}$) logic circuits for 3 (n=3) bit input logic circuits, the total nanoparticle set of the 3 ($=$n) NMs, 4 ($=2^{3-1}$) NFs, and one NR, with the 25 types of instruction DNAs (24 trap DNAs and one report DNA) is required.

The concept for executing the neural network is proved and the reusability of the NVNA is confirmed through the foregoing description.

The NNN system according to the exemplary embodiment is combined with the reset function, so that the system

TABLE 1

| NF1 NM$_{A0}$ Trap DNA TD1 | NF1 NM$_{A1}$ Trap DNA TD2 | NF1 NM$_{B0}$ Trap DNA TD3 | NF1 NM$_{B1}$ Trap DNA TD4 | NF2 NM$_{A0}$ Trap DNA TD5 | NF2 NM$_{A1}$ Trap DNA TD6 | NF2 NM$_{B0}$ Trap DNA TD7 | NF2 NM$_{B1}$ Trap DNA TD8 | Report DNA (RD) | Logic operation | Output (Input) 0, and 0 0, and 1 1, and 0 1, and 1 |
|---|---|---|---|---|---|---|---|---|---|---|
| 1 | 1 | 1 | 1 | 1 | 1 | 1 | 1 | 0/1 | False | 0 0 0 0 |
| 0 | 0 | 0 | 0 | 0 | 0 | 0 | 0 | 1 | True | 1 1 1 1 |
| 1 | 0 | 0 | 0 | 1 | 1 | 1 | 1 | 1 | YES A | 0 0 1 1 |
| 0 | 1 | 0 | 0 | 1 | 1 | 1 | 1 | 1 | NOT A | 1 1 0 0 |
| 0 | 0 | 1 | 0 | 1 | 1 | 1 | 1 | 1 | YES B | 0 1 0 1 |
| 0 | 0 | 0 | 1 | 1 | 1 | 1 | 1 | 1 | NOT B | 1 0 1 0 |
| 1 | 0 | 1 | 0 | 1 | 1 | 1 | 1 | 1 | A AND B | 0 0 0 1 |
| 1 | 0 | 0 | 1 | 1 | 1 | 1 | 1 | 1 | A AND -B | 0 0 1 0 |
| 0 | 1 | 1 | 0 | 1 | 1 | 1 | 1 | 1 | -A AND B | 0 1 0 0 |
| 0 | 1 | 0 | 1 | 1 | 1 | 1 | 1 | 1 | A NOR B | 1 0 0 0 |
| 1 | 0 | 0 | 0 | 0 | 1 | 1 | 0 | 1 | A OR B | 0 1 1 1 |
| 1 | 0 | 0 | 0 | 1 | 0 | 0 | 1 | 1 | A OR -B | 1 0 1 1 |
| 0 | 1 | 0 | 0 | 1 | 0 | 1 | 0 | 1 | -A OR B | 1 1 0 1 |
| 0 | 1 | 0 | 0 | 1 | 0 | 0 | 1 | 1 | A NAND B | 1 1 1 0 |
| 1 | 0 | 0 | 1 | 0 | 1 | 1 | 0 | 1 | A XOR B | 0 1 1 0 |
| 0 | 1 | 0 | 1 | 1 | 1 | 0 | 0 | 1 | A XNOR B | 1 0 0 1 |

The logic gate that yields the single output "1" only in one of the four input combinations, such as AND, INH, and NOR, may be implemented by using the single layer perceptron. As there are two types of NMs, which store inputs A and B, respectively, the NF clearly differentiates the relative kinetics on three binding channels for two NMs and one NR with the input combinations, thereby generating the result of logic gates.

Next, the multilayer perceptron may be designed by using the plurality of nodes in the hidden layer by introducing the multiple NFs. The plurality of NFs has different DNA domains to trap the trap DNAs, but may share the same domain for binding with the Report DNAs.

Using the nanoparticle-based multilayer perceptron, the two-input OR, NAND, XOR, and XNOR may be implemented by changing the combination of the trap DNAs. Owing to the two types of NF, the output "1" may have a maximum assembly ratio of approximately 50%. Although the multilayer perceptron exhibited certain density differmay be additionally utilized through a sequential decision-making process using a decision tree.

Figure 23:
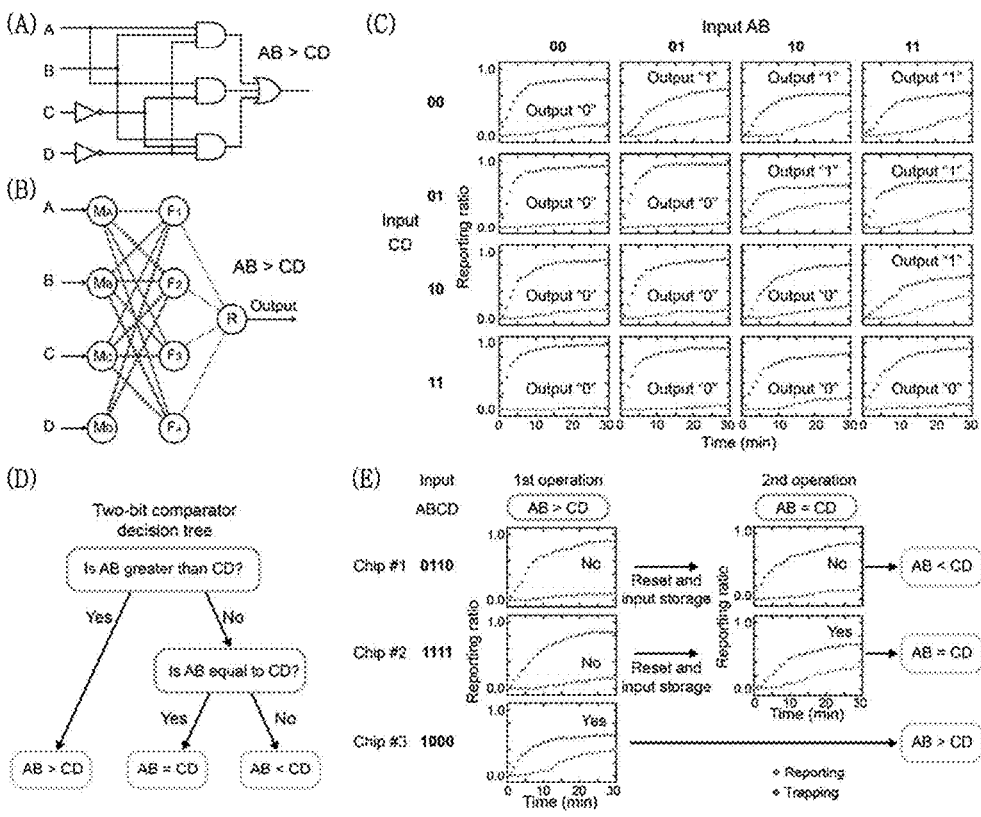
FIG. 23 is a diagram illustrating a comparator representing a relative quantity of two 2-bit inputs in a single chip according to the exemplary embodiment.

FIG. 23 is a diagram illustrating a comparator representing a relative quantity of two 2-bit inputs in a single chip according to the exemplary embodiment.

As illustrated in FIG. 23, the exemplary embodiment relates to a 2-bit comparator for comparing the quantities of two 2-bit inputs (4-bit inputs in total)

As illustrated in D of FIG. 23, the decision tree that is two-hierarchy tree structure resembles a flowchart that follows a next node from top to bottom based on a result of a previous node (for example, YES or NO) to produce a final decision.

First, the first decision-making node, "Is input AB greater than input BC?" represented with the electric logic circuit diagram may be the NNN diagram with four nodes in the hidden layer.

(A) of FIG. 23 is the digital logic circuit diagram for calculating AB>CD, and when AB>CD is satisfied, the output "1" is generated.

(B) of FIG. 23 is the NNN Diagram representing a 2-bit comparator. In the NNN diagram, the trap DNA between each of the $NM_A M_A$, $NM_B M_B$, $NM_C$ Mc, and $NM_D M_D$ of the input layer and $NF_1 F_1$, $NF_2 F_2$, $NF_3 F_3$, and $NF_4 F_4$ of the hidden layer is set to determine AB>CD, and the solid line is the trap DNA that binds each of the $NF_1$ to $NF_4$ to the NM when the inputs of the $NM_A$ to $NM_D$ are 0, and the dotted line is the trap DNA that binds each of the $NF_1$ to $NF_4$ to the NM when the inputs of the $NM_A$ to $NM_D$ are 1. The trap DNAs between the $NF_1$ to $NF_4$ and the $NM_A$ to $NM_D$ will be described below.

The results of the 16 input cases illustrated in (C) of FIG. 23 show that the NNN system according to the exemplary embodiment successfully generates the output "1" only when the input AB is larger than the input CD. The number of nanoparticle nodes and the complexity of the logical circuit are increased, but the reaction kinetics identically remained at least 30 minutes due to the parallel reactions of the multilayer perceptron.

As illustrated in (D) of FIG. 23, by using the powerful programmability and reset function of the NVNA, it is possible to sequentially operated the 2-bit comparator.

As illustrated in (E) of FIG. 23, when the result of the first operation (AB>CD determination) is false, the next operation progresses to confirm whether input AB is equal to input CD, equal, or input CD is larger than input AB. As illustrated in (D) of FIG. 23, if it is not AB>CD, it is determined that AB=CD, and when it is not AB=CD as the result of the determination, AB<CD is finally satisfied. The input is varied according to each of the AB>CD determination and the AB=CD determination, and the relative quantity between the AB and the CD is identified by the output ("1" or "0") of the NNN system, and the quantity comparison result between the inputs AB and CD may be identified as "Yes" or "No" according to the result of the identification.

The input of Chip #1 of (E) of FIG. 23 is "0110", and the result of the first operation (AB>CD determination) is "No", the input is stored after the reset, and the second operation (AB=CD) progresses by changing the trap DNA.

Figure 24:
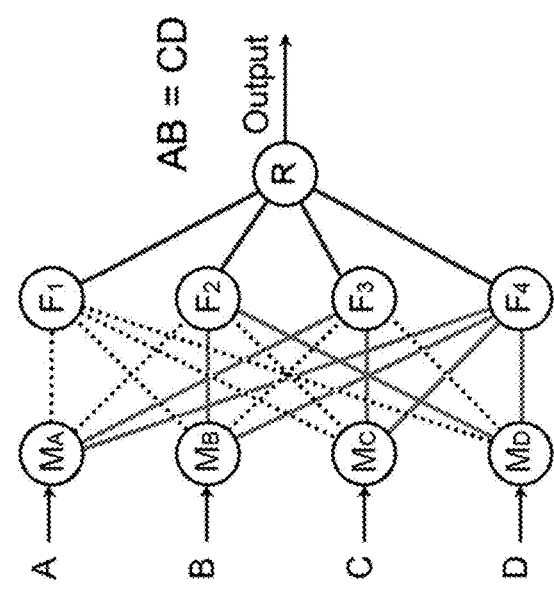
FIG. 24 is a logic circuit diagram of an equivalent gate and an NNN diagram.
Figure 24:
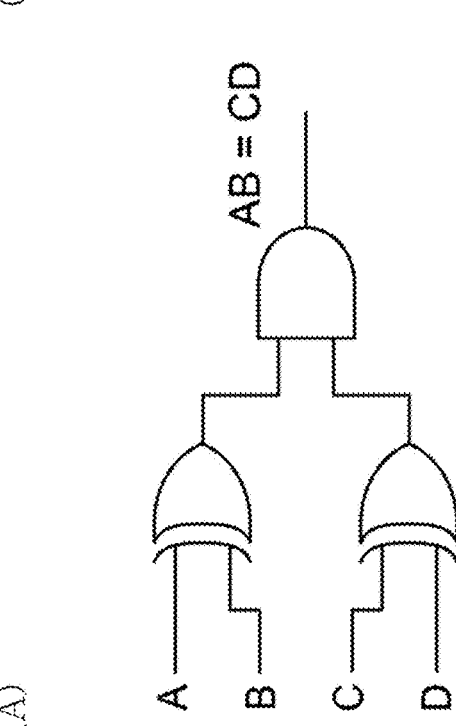

FIG. 24 is a logic circuit diagram of an equivalent gate and an NNN diagram.

As illustrated in FIG. 24, the inputs A, B, C, and D are stored in the $NM_A$ to $NM_D$ of the input layer, and the trap DNA between each of the $NM_A$ to $NM_D$ of the input layer and each of the $NF_1$ to $NF_4$ of the hidden layer is reset in accordance with the equivalent gate. The result of the second operation (AB=CD determination) of FIG. 23 is also "No", AB<CD.

The input of Chip #2 of (E) of FIG. 23 is "1111", and the result of the first operation (AB>CD determination) is "No", the input is stored after the reset, and the second operation (AB=CD) progresses by changing the trap DNA. The result of the second operation (AB=CD determination) of FIG. 23 is also YES", so that AB=CD.

The input of Chip #3 of (E) of FIG. 23 is "1000", and the result of the first operation (AB>CD determination) is "Yes", AB>CD.

In the LNT, nanoscale geometric features and optical properties of the plasmonic nanoparticle core are critical for computing. The time-delayed assembly between the NF and NR with the report DNA is attributable to the DNA sequence design and multivalent DNA strand interactions on the single nanoparticle surface. Furthermore, the number of outputs may be increased by adding other pairs of nanoparticle interactions with different scattering colors. With the introduction of blue-scattering NFs along with green-scattering NFs, fan-out logic circuits that operate YES and NOT gates simultaneously with two outputs distinguished by optical signals may be executed.

Figure 25:
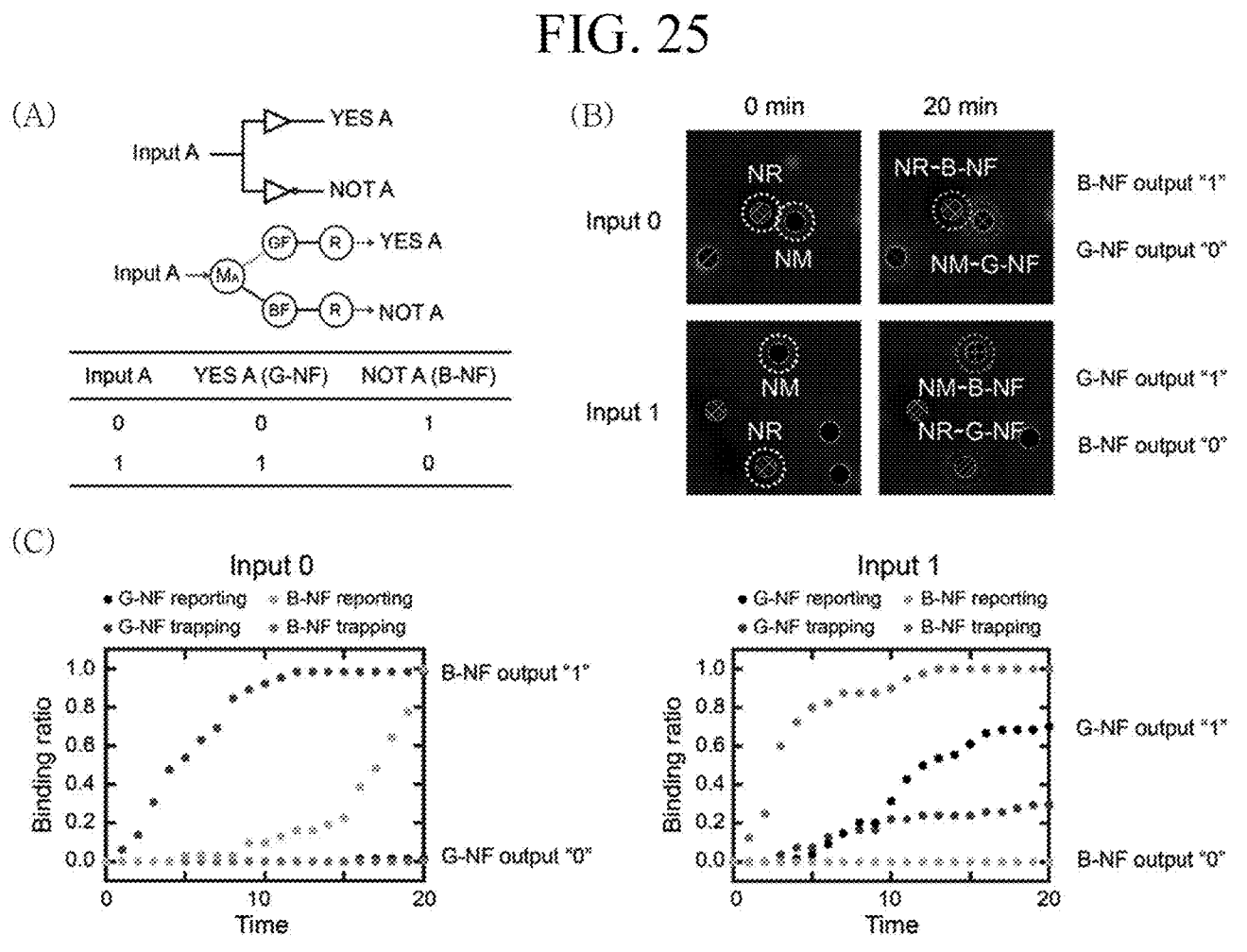

FIG. 25 is a diagram illustrating an operation of a fan output logic circuit according to the exemplary embodiment.

(A) of FIG. 25 is the logic circuit and NNN diagram for the fan output logic circuit. Two NFs G-NF and B-NF having distinct optical scattering colors of green and blue is used in the fan out logic circuit. The G-NF executes YES A and the B-NF executes NOT A.

(B) of FIG. 25 illustrates a logic operation monitored with a dark-field microscope. The reporting and the trapping of each of the G-NF and the B-NF generate optically discernable color change. In (B) of FIG. 25, the scattering color of the NR-B-NF is indicated with blue-green (lattice-patterned circle), and the scattering color of the NM-G-NF is indicated with yellow (X-patterned circle). Further, the scattering color of the NM-B-NF is indicated with green-blue (+-patterned circle), and the scattering color of the NR-G-NF is indicated with green (hatched circle).

(C) of FIG. 25 is a result of the quantitative analysis of the fan out logic circuit.

The B-NF shows that the reaction rate is slow in the reporting. This is due to the low DNA density of the silver nanoparticles. The B-NF is reported slowly, but generates the output "1" or "0" according to the input and the operation of the NOT gate.

Further, the various characteristics and functions of the nanoparticles and the ligands may be utilized in the computing system. For example, the photothermal characteristic may implement the light-induced elimination function through dehybridization of the loaded molecule, or the magnetic characteristic may enhance the reaction rate by controlling the local concentration of NF spatiotemporally.

In the exemplary embodiment, it is possible to simplify the basic reaction modules by only using the hybridization between single stranded DNAs through kinetics control, without relying on enzymatic or strand displacement reaction. Therefore, the computing strategy in LNT can be intuitively applicable to other types of molecules, such as proteins, peptides, ionic species, small chemicals, and RNA. As the main purpose of the instruction DNA is to create and control links between nanoparticles with molecular information, other chimeric linkers, such as DNA-antibody or chemical ligand-aptamer conjugates, may serve as the Instruction molecules with binding moieties on both ends.

The LNT platform according to the exemplary embodiment may be expanded in various directions following the development of neural networks. In the aspect of NNN, instead of using digital values of inputs and weights, varying the weights and inputs to analogue values can be realized with the biochemical molecules via controlling kinetics and ligand density/modification, enabling sophisticated neural network operations for molecular pattern recognition. The number of NFs required for functional completeness exponentially increases as the number of inputs increases, but it is possible to solve the issue by adopting more than one hidden layer by which the fewer number of NFs can cover the same function.

So far, it has been described that the NVNA implemented in the LNT platform according to the exemplary embodiment can be widely applied and provides the scalable molecular computing. It is possible to realize the NNN having the simple reset function through the computing architecture according to the exemplary embodiment. When the NVNA is constructed, the nanoparticle memory, the instruction DNA, and the DNA binding rate-control output are used, and the solution serves to store, process, and reset information similar to the bus concept of electronic computing.

The NNN composed of the perceptron, the hidden layer, and the like according to the exemplary embodiment is realized to the NVNA of the lipid chip. The NVNA system may perform the sequential decision-making process according to the decision-making tree, and may be combined with the reset function and reused.

In the present disclosure, the nanoparticle-based computing architecture is established, and the NNN provides modulated and scalable molecular computing with the single nanoparticle set and the sub set of the instruction DNAs. In general, the nano devices uses new nanoparticle designs for specific functions as their structures define their functions in nanotechnology/life science. However, the exemplary embodiment provides complete diversity of functions together with the nanoparticle network. When the NVNA is used, powerful, scalable, and practical programming functions may be provided in a wide range nanoparticle-based computing application programs. The NNN may provide opportunities to use nanoparticles in deep learning-based science and technology, neural interfaces, and neural morphology computing.

The exemplary embodiment may provide various intelligent molecular nano computing systems, such as intelligent diagnostic nano devices capable of managing and analyzing complex biomolecular information. For example, consecutive decisions may be made from blood samples for cancer diagnosis, such as "Is it cancer?", "Is it lung cancer?", "is lung cancer subtype is 1", and "How much has lung cancer subtype 1 progressed?". Further, the LNT chip may be integrated with the compact NVNA computing architecture of a microfluidic device, and the intricate network of interactions among molecules in the solution and nanoparticles on the lipid chip may be used to mimic and interrogate complex living systems.

The domain and base sequence of the strand bound to the surface of each of the NMs, that is, $M_A$, $M_B$, Mc, and $M_D$, the NFs, that is $F_1$, $F_2$, $F_3$, and $F_4$, and the NR, that is, R, illustrated in FIGS. 15 to 17, FIGS. 18 to 21, FIG. 23, and FIG. 24 is represented in Table 2 below.

The corresponding strands for binding to the corresponding NM are bound to 59% of the surface of each of the $NF_1$ to $NF_4$, the same NF-Reporting strands for reporting are bound to 40% of the surface of each of the $NF_1$ to $NF_4$, and the NF biotin strands to be attached to the supported lipid bilayer are bound 1% of the surface of each of the $NF_1$ to $NF_4$.

The corresponding strands for binding to the corresponding NF are bound to 60% of the surface of each of the $NM_1$ to $NM_4$, and the NM biotin strands to be attached to the supported lipid bilayer are bound to 40% of the surface of each of the $NM_1$ to NW.

The strands for binding to the NF are bound to 60% of the surface of the NR, and the NM biotin strands to be attached to the supported lipid bilayer are bound to 40% of the surface of the NR.

(TABLE 2)

| Strand (ratio on NPs) | domain (nt) | Sequence (5' to 3') |
|---|---|---|
| NF1 59% | SH-A 15-dummy-f1 14 | Thiol-AAAAAA AAAAAAAAA AAC TGCCATTCATTT ACCGTCTAC (Thiol-SEQ ID NO: 1) |
| NF2 59% | SH-A 15-dummy-f2 14 | Thiol-AAAAAA AAAAAAAAA TAA ACCCATGCTAAC CGCTAACAC (Thiol-SEQ ID NO: 2) |
| NF3 59% | SH-A 15-dummy-f3 14 | Thiol-AAAAAA AAAAAAAAA TCT TAAAGTCCCGTC ACAGTCTAC (Thiol-SEQ ID NO: 3) |
| NF4 59% | SH-A 15-dummy-f4 14 | Thiol-AAAAAA AAAAAAAAA ACC AAAGACCCAAGA TACTCGCAC (Thiol-SEQ ID NO: 4) |
| NF-Reporting 40% | SH-A 15-dummy-fr 14 | Thiol-AAAAAAA AAAAAAAA CGCAC TAAGACGAATTCA CTTTTC (Thiol-SEQ ID NO: 5) |
| NF biotin 1% | SH-A 15-dummy-biotin | Thiol-AAAAAAA AAAAAAAA ATAAC GAGCATCGAACTT ACATCGCGTTACT ACACTGTCACTGA TCATCGCATGCTA TAC-biotin (Thiol-SEQ ID NO: 6-biotin) |
| $NM_A$ 60% | a0 24-A 15-SH | CACAACATAGAAT CACGTACATAAAA AAAAAAAAAAAA A-Thiol (SEQ ID NO: 7-Thiol) |
| $NM_B$ 60% | b0 24-A 15-SH | CCGTTCTACAAAT CAAAGCGCATCAA AAAAAAAAAAAA A-Thiol (SEQ ID NO: 8-Thiol) |
| $NM_C$ 60% | c0 24-A 15-SH | CTCGTCACTCTAG CACAATCTCGAAA AAAAAAAAAAAA A-Thiol (SEQ ID NO: 9-Thiol) |
| $NM_D$ 60% | d0 24-A 15-SH | CATAATCTATAAT CATCCTCATAAAA AAAAAAAAAAAA A-Thiol (SEQ ID NO: 10-Thiol) |

(TABLE 2)-continued

| Strand (ratio on NPs) | domain (nt) | Sequence (5' to 3') |
|---|---|---|
| NM biotin 40% | biotin-dummy-A 15-SH | biotin-CTCTCT GCCTCGTTCAGAC AAAACTCATCCTA CTAAAAAAAAAAA AAAA-Thiol (biotin-SEQ ID NO: 11-Thiol) |
| NR 60% | r8-dummy-A 15-SH | CAATAACG ACAAA CTAATTCAGCAAA AAAAAAAAAAAA A-Thiol (SEQ ID NO: 12-Thiol) |
| NR biotin 40% | biotin-dummy-A 15-SH | biotin-CTCTCT GCCTCGTTCAGAC AAAACTCATCCTA CTCGATACTTTCT GTAACTTTTCCTT AA AAAAAAAAAA AAAA-Thiol (biotin-SEQ ID NO: 13-Thiol) |

Further, the domain and the base sequence of each of the inputs A, B, C, and D illustrated in FIGS. 15 to 17, FIGS. 18 to 21, FIG. 23, and FIG. 24 are represented in Table 3 below.

(TABLE 3)

| Strand | domain (nt) | Sequence (5' to 3') | SEQ ID NO: |
|---|---|---|---|
| Input A | a0* 24-a1* 14 | TTATGTACGTGA TTCTATGTTGTG GATTGTTTTCTA GG | 14 |
| Input B | b0* 24-b1* 14 | GATGCGCTTTGAT TTGTAGAACGGGA TAGGCGACATAG | 15 |
| Input C | c0* 24-c1* 14 | TCGAGATTGTGCT AGAGTGACGAGGA TGTCAGGGACAG | 16 |
| Input D | d0* 24-d1* 14 | TTATGAGGATGAT TATAGATTATGGT ATTTAGAAAATG | 17 |

Further, the domain and the base sequence of each of the instruction DNAs illustrated in FIGS. 15 to 17, FIGS. 18 to 21, FIG. 23, and FIG. 24 are represented in Table 4 below.

(TABLE 4)

| Strand | domain (nt) | Sequence (5' to 3') | SEQ ID NO: |
|---|---|---|---|
| Report DNA | r* 8-dummy-fr* 14 | CGTTATTG AA TCCTTAGAGA AAAGTGAATT CG | 18 |

(TABLE 4)-continued

| | | Sequence | SEQ ID |
|---|---|---|---|
| NF1 NM$_{A0}$ Trap DNA | a0s* 14-dummy-f1* 14 | GATTCTATGT TGTG CCTTCA TTAAGTAGAC GGTAAATG | 19 |
| NF1 NM$_{A1}$Trap DNA | a1 14-dummy-f1* 14 | CCTAGAAAAC AATC TCTCGT ATTCGTAGAC GGTAAATG | 20 |
| NF1 NM$_{B0}$ Trap DNA | b0s* 14-dummy-f1* 14 | GATTTGTAGA ACGG ATATCA TTACGTAGAC GGTAAATG | 21 |
| NF1 NM$_{B1}$ Trap DNA | b1 14-dummy-f1* 14 | CTATGTCGCC TATC CATATA CAGCGTAGAC GGTAAATG | 22 |
| NF1 NM$_{C0}$ Trap DNA | c0s* 14-dummy-f1* 14 | GCTAGAGTGA CGAG AAGATA TACCGTAGAC GGTAAATG | 23 |
| NF1 NM$_{C1}$ Trap DNA | c1 14-dummy-f1* 14 | CTGTCCCTGA CATC TTCTTA TCTCGTAGAC GGTAAATG | 24 |
| NF1 NM$_{D0}$ Trap DNA | d0* 14-dummy-f1* 14 | GATTATAGAT TATG CCTACG TCTAGTAGAC GGTAAATG | 25 |
| NF1 NM$_{D1}$ Trap DNA | d1 14-dummy-f1* 14 | CATTTTCTAA ATAC ACAGCT AACAGTAGAC GGTAAATG | 26 |
| NF2 NM$_{A0}$ Trap DNA | a0s* 14-dummy-f2* 14 | GATTCTATGT TGTG TTCTTT ACCAGTGTTA GCGGTTAG | 27 |
| NF2 NM$_{A1}$Trap DNA | a1 14-dummy-f2* 14 | CCTAGAAAAC AATC TATGCC TACTGTGTTA GCGGTTAG | 28 |
| NF2 NM$_{B0}$ Trap DNA | b0s* 14-dummy-f2* 14 | GATTTGTAGA ACGG AACATT ACCAGTGTTA GCGGTTAG | 29 |
| NF2 NMb1 Trap DNA | b1 14-dummy-f2* 14 | CTATGTCGCC TATC TTAAAC CGTAGTGTTA GCGGTTAG | 30 |
| NF2 NM$_{C0}$ Trap DNA | c0s* 14-dummy-f2* 14 | GCTAGAGTGA CGAG ATACCA AATAGTGTTA GCGGTTAG | 31 |
| NF2 NM$_{C1}$ Trap DNA | c1 14-dummy-f2* 14 | CTGTCCCTGA CATC ACTACT ATTTGTGTTA GCGGTTAG | 32 |
| NF2 NM$_{D0}$ Trap DNA | d0* 14-dummy-f2* 14 | GATTATAGAT TATG ACAGTC GCAGGTGTTA GCGGTTAG | 33 |

(TABLE 4)-continued

| | | | Sequence | SEQ ID |
|---|---|---|---|---|
| NF2 NM$_{D1}$ Trap DNA | d1 14-dummy-f2* 14 | | CATTTTCTAA ATAC CACGGC CTTGGTGTTA GCGGTTAG | 34 |
| NF3 NM$_{A0}$ Trap DNA | a0s* 14-dummy-f3* 14 | | GATTCTATGT TGTG AGCTTC ATGCGTAGAC TGTGACGG | 35 |
| NF3 NM$_{A1}$ Trap DNA | a1 14-dummy-f3* 14 | | CCTAGAAAAC AATC TCCAGT CTTTGTAGAC TGTGACGG | 36 |
| NF3 NM$_{B0}$ Trap DNA | b0s* 14-dummy-f3* 14 | | GATTTGTAGA ACGG AACCTA GTAAGTAGAC TGTGACGG | 37 |
| NF3 NM$_{B1}$ Trap DNA | b1 14-dummy-f3* 14 | | CTATGTCGCC TATC TAACCT TACAGTAGAC TGTGACGG | 38 |
| NF3 NM$_{C0}$ Trap DNA | c0s* 14-dummy-f3* 14 | | GCTAGAGTGA CGAG CTTGCA AACAGTAGAC TGTGACGG | 39 |
| NF3 NM$_{C1}$ Trap DNA | c1 14-dummy-f3* 14 | | CTGTCCCTGA CATC TAATCA AGCAGTAGAC TGTGACGG | 40 |
| NF3 NM$_{D0}$ Trap DNA | d0s* 14-dummy-f3* 14 | | GATTATAGAT TAT GAACCTA GTAA | 41 |
| NF3 NM$_{D1}$ Trap DNA | d1 14-dummy-f3* 14 | | CATTTTCTAA ATAC TAACCT TACAGTAGAC TGTGACGG | 42 |
| NF4 NM$_{A0}$ Trap DNA | a0s* 14-dummy-f4* 14 | | GATTCTATGT TGTG TTACAA TAACGTGCGA GTATCTTG | 43 |
| NF4 NM$_{A1}$Trap DNA | a1 14-dummy-f4* 14 | | CCTAGAAAAC AATC TATCAC ACAGGTGCGA GTATCTTG | 44 |
| NF4 NM$_{B0}$ Trap DNA | b0s* 14-dummy-f4* 14 | | GATTTGTAGA ACGG ACACTT TGCGGTGCGA GTATCTTG | 45 |
| NF4 NM$_{B1}$ Trap DNA | b1 14-dummy-f4* 14 | | CTATGTCGCC TATC CAAATA GAATGTGCGA GTATCTTG | 46 |
| NF4 NM$_{C0}$ Trap DNA | c0s* 14-dummy-f4* 14 | | GCTAGAGTGA CGAGA TATCA CAAGGTGCGA GTATCTTG | 47 |
| NF4 NM$_{C1}$ Trap DNA | c1 14-dummy-f4* 14 | | CTGTCCCTGA CATC TACTTA CGATGTGCGA GTATCTTG | 48 |

(TABLE 4)-continued

| | | | Sequence | SEQ ID |
|---|---|---|---|---|
| NF4 NM$_{D0}$ Trap DNA | d0s* 14-dummy-f4* 14 | | GATTATAGAT TATG ACACTT TGCGGTGCGA GTATCTTG | 49 |
| NF4 NM$_{D1}$ Trap DNA | d1 14-dummy-f4* 14 | | CATTTTCTA AATAC CAAA TAGAATGTG CGAGTATCT TG | 50 |

The Trap DNAs includes trap DNAs which binds each of the NF$_1$ to NF$_4$ to one of the NM$_A$ to NM$_D$ in which the storage state is 0 or 1. The report DNA binds each of the NF$_1$ to NF$_4$ to the NR.

Preparation of Small Unilamellar Vesicles (SUVs)

After sonication cleaning of a 50 mL round bottom flask with 99.5% chloroform (DAEJUNG, South Korea), 97.2 mol % dioleoylphosphatidylcholine (DOPC), 0.4 mol % biotinylated dioleoylphosphatidylethanolamine (DOPE), and 2.5 mol % poly(ethylene glycol) 1000 (PEG 1000)-DOPE (all three lipids were purchased from Avanti, USA) were mixed in the solution of 99.8% chloroform (SAMC-HUN, South Korea). Chloroform solvent was removed via a rotary evaporator, which left a lipid mixture ring film in the round bottom flask. To ensure removal of all chloroform, N$_2$ blowing for 5 min was followed. The mixture was re-suspended in de-ionized water (DIW), resulting in lipid solution in the concentration of 2 mg/mL. The solution was taken three freeze-thaw steps from −76° C. to 25° C. and kept in liquid nitrogen. To make small unilamellar vesicles (SUVs), after unfreeze the lipid solution at 25° C., we conducted 30-min sonication before use.

Preparation of Supported Lipid Bilayer (SLB) Chamber

SLB was formed on hydrophilic supporting substrates. We used the vesicle fusion method to get SLBs in the flow chamber. We used flow chamber consisting of top slide glass, Parafilm spacer (4 mm×50 mm×200 μm), and bottom cover glass (both glasses are purchased from Paul Marienfeld GmbH & Co. KG, Germany). The inner volume of the flow chamber is ~40 μL. The top slide glass, which has inlet and outlet holes, and the bottom cover glass were cleaned by 10 min sonication in DIW and 10 min piranha etching in H$_2$SO$_4$/H$_2$O$_2$ (3:1), and were thoroughly rinsed with DIW. To prevent SLB formation on the top glass, we passivated the top slide glass with bovine serum albumin (BSA) (10 mg/mL) in 150 mM NaCl phosphate-buffered saline (1×PBS) for 30 min. The flow chamber was assembled with placing double layer Parafilm spacer between the two glasses and heat sealing at 105° C. Next, the SUV solution was diluted to 1 mg/mL in 1×PBS solution and sonicated additionally for 15 min. The SUV solution is injected into the flow chamber and incubated for 40 min to form a lipid bilayer on the bottom of the chamber. The flow chamber was gently washed by injection of DIW (200 μL, twice) and 1×PBS (200 μL, once), and passivated with BSA (30 μg/mL) in 1×PBS for 30 min. Streptavidin (40 nM) in 1×PBS was injected into the flow chamber and incubated for 90 min to modify biotinylated DOPE in SLBs. Finally, the flow chamber was washed with 1×PBS (200 µL, twice), and modified with DNA-functionalized nanoparticles for further experiments.

Synthesis and Characterization of Plasmonic Nanoparticles

Spherical gold nanoparticles (AuNPs) (diameter, 50.5±3.5 nm) for green-scattering color were purchased from BBI Solutions (Cardiff, UK). Gold-silver core-shell nanoparticles (Au@Ag NPs) (diameter, 50.3±4.7 nm) for blue-scattering color were synthesized by following seed-mediated growth method. We prepared CTAB-capped seeds. Cetyltrimethylammonium bromide (CTAB) solution (9.75 mL, 100 mM) was mixed with $HAuCl_4$ solution (250 µL, 10 mM). Freshly made ice-cold $NaBH_4$ solution (600 µL, 10 mM) was added quickly to the mixture with vigorous stirring for 3 min. The synthesized 1-2 nm seeds were incubated at 27° C. for 3 h before the next step. 10-nm gold core nanoparticles were then synthesized with the seeds. CTAC (2 mL, 200 mM), L-ascorbic acid (1.5 mL, 100 mM), and the previously prepared CTAB-capped seed solution (50 µL) were sequentially mixed. $HAuCl_4$ solution (2 mL, 0.5 mM) was injected with one shot while the solution was being mixed and incubated at 25° C. for 15 min with stirring at 300 rpm. After incubation, the 10-nm gold cores were washed by centrifugation and redispersed in cetyltrimethylammonium chloride (CTAC) solution (1 mL, 20 mM). Finally, we grew a silver shell on the gold core. We mixed the gold core solution (5 µL, 1.77 pM) with CTAC solution (100 µL, 100 mM), $AgNO_3$ solution (30 µL, 1 mM), and $NH_4OH$ solution (5 µL, ACS reagent, 28.0-30.0% $NH_3$ basis) sequentially. After gold core solution and L-ascorbic acid solution (100 mM) were mixed and heated to 50° C., the L-ascorbic acid solution (50 µL) was quickly injected and rapidly mixed. The solution was washed via centrifugation and redispersed in 1% polyvinylpyrrolidone (PVP) solution for further oligonucleotide modification. The grown silver shell thickness was ~20 nm. All NPs were characterized by transmission electron microscopy (TEM) (JEM-2100, JEOL Ltd., Japan), UV-Vis spectrophotometry (Agilent 8453, Agilent Technologies, USA) and DFM (Axiovert 200 M, Carl Zeiss, Göttingen, Germany). TEM imaging was carried out at the National Center for Inter-University Research Facilities (Seoul National University, Seoul, South Korea).

Functionalization of Plasmonic Nanoparticles

Gold and silver nanoparticles are modified with thiolated DNA oligonucleotides via strong gold-thiol and silver-thiol bond. To cleave the dithiol bond, thiol modified oligonucleotides (Integrated DNA Technologies, USA) are incubated with dithiothreitol (100 mM) in pH 8.0 phosphate buffer for 1 hour. The DNA was purified through size exclusion chromatography using a NAP-5 column (GE Healthcare, Buckinghamshire, UK), and the concentration of monothiolated DNA was measured by UV-Vis spectroscopy. Nanoparticles (10 fmole) were mixed with the thiolated oligonucleotides (200 pmole), at 0.1% (w/v) sodium dodecyl sulfate (SDS) solution (300 mL), and incubated for 1 h at 25° C. The ratios of thiolated strands for Nano-Floater (NF), Nano-Memory (NM), Nano-Reporter (NR) are summarized in Table S2. Three aliquots of 1 M NaCl, 0.1% SDS, and 10 mM PB salt solution were added with a 1-hour interval to achieve a final concentration of 0.3 M NaCl for NF and NR, and 0.25 M NaCl for NM. The solution was sonicated for 10 seconds after each salt aging, and incubated overnight at 25° C. The nanoparticles were centrifuge-washed and re-dispersed in 10 mM PB solution.

Data Storage on NM and Nanoparticle Neural Network (NNN) Execution on LNT

NF, $NM_1$ and NR of which concentration range between 1 to 10 pM in 1×PBS were loaded on LNT for 10 min to reach a proper density of particles (0.1 to 0.2 $mm^{-2}$ for NM, ~0.02 $mm^{-2}$ for NF, and ~0.02 $mm^{-2}$ for NR) on SLB. To achieve trapping faster than reporting, we loaded the density of NM 5 to 10 times higher than that of NR. To fully store molecular information of Input DNAs on $NM_1$ we incubated each Input DNA at 50 nM concentration for 30 min and washed with 1×PBS. The mixture of Instruction DNAs (8 nM Trap DNAs and 1 nM Report DNA) in 1×PBS were injected to the chamber. The nanoparticle logic circuit operation was monitored via DFM for 30 minutes. The sequences of Instruction DNAs are summarized in Table S3.

To reset the LNT and reuse for the next operation, all the hybridized Input DNAs and the Instruction DNAs need to be removed from the nanoparticles. We increased the temperature and decreased the salt concentration of the solution over the melting temperature to make solution temperature is greater than the melting temperature of DNA hybridization. PB solution (5 mM) was injected, and incubate the LNT chamber at 50° C. for 30 minutes to detach the hybridized DNAs. We then washed with PB solution (5 mM, 50° C.). For the next operation, 1×PBS solution was injected to recover the salt concentration and temperature.

Analyzing Dark-Field Time-Lapse Images

To analyze obtained dark-field time-lapse images, we used the previously developed custom MATLAB code from our lab (8). Images were registered with The StackReg plugin in ImageJ, choosing the area of interest (100×100 $mm^2$) and correcting the movement. The image sequences were processed by an image analysis algorithm that enables single-particle signal tracking, signal configuration, and classification. Analyzing the NP's movement and RGB profile, it classifies NPs into NRs, NFs and NMs. The nanoparticle assemblies were quantitatively counted by monitoring scattering color change at the position of NR and NM (immobile NPs) upon NF binding.

While this invention has been described in connection with what is presently considered to be practical exemplary embodiments, it is to be understood that the invention is not limited to the disclosed embodiments. On the contrary, it is intended to cover various modifications and equivalent arrangements included within the spirit and scope of the appended claims.

DESCRIPTION OF SYMBOLS

1: Hardware chip

2: Software

3: LNT (lipid nanotablet)

What is claimed is:

1. A nano computing device, comprising:

a nanoparticle memory including a first molecule bound so as to store a molecular input; wherein the nanoparticle memory comprises a nanoparticle functionalized with a plurality of single-stranded DNA domains configured to hybridize with an input DNA representing a logic "0" or logic "1", the input DNA modifying an exposed single-stranded region of the nanoparticle memory so as to define its storage state;

a nanoparticle reporter including a second molecule bound so as to generate an output; wherein the nanoparticle reporter comprises a nanoparticle functionalized with a plurality of reporter-binding DNA domains configured to bind a nanoparticle floater through multivalent hybridization with a report DNA strand having a hybridization domain of lower melting temperature than trap DNA, such that assembly of the nanoparticle floater to the nanoparticle reporter produces a detectable optical scattering change representing a logic output; and a nanoparticle floater including at least a third molecules and fourth molecules so as to be bound to one of the nanoparticle memory and the nanoparticle reporter based on the molecular input and an instruction molecule, wherein the nanoparticle floater comprises a mobile nanoparticle possessing at least two distinct hybridization domains, including (i) a trap-binding domain configured to hybridize to a memory-specific trap DNA corresponding to the storage state of the nanoparticle memory, and (ii) a reporter-binding domain configured to hybridize to a report DNA for assembly to the nanoparticle reporter, the nanoparticle floater being freely diffusible on a supported lipid bilayer until selectively captured by trap DNA or report DNA;

wherein:

the nanoparticle floater is selectively bound to the nanoparticle memory over the nanoparticle reporter due to a competition wherein a first reaction rate between the nanoparticle memory and the nanoparticle floater by a first instruction molecule among instruction molecules is faster than a second reaction rate between the nanoparticle reporter and the nanoparticle floater by a second instruction molecule among the instruction molecules; wherein the first reaction rate comprises a diffusion-limited hybridization of a trap DNA having a hybridization domain length of about 14 nucleotides and a melting temperature above about 40° C., resulting in rapid nanoparticle memory-nanoparticle floater assembly; and wherein the second reaction rate comprises a slower, kinetically delayed assembly via a report DNA having a hybridization domain of about 8 nucleotides and a melting temperature below about 20° C., such that reporter assembly requires multivalent interactions and proceeds only after a trap-DNA mediated reaction window has elapsed.

2. The nano computing device of claim 1, wherein:
the molecular input includes a molecular input indicating logic 1.

3. The nano computing device of claim 1, wherein:
the instruction molecule
includes at least one of a trap DNA that binds the nanoparticle floater to the nanoparticle memory and a report DNA that binds the nanoparticle floater to the nanoparticle reporter.

4. The nano computing device of claim 3, wherein:
the trap DNA includes:
a first trap DNA that binds the nanoparticle floater and the nanoparticle memory when a storage state of the nanoparticle memory indicates logic 0; and
a second trap DNA that binds the nanoparticle floater and the nanoparticle memory when a storage state of the nanoparticle memory indicates logic 1.

5. The nano computing device of claim 4, wherein:
the first trap DNA binds the first molecule and the third molecule when the storage state of the nanoparticle memory indicates logic 0.

6. The nano computing device of claim 4, wherein:
the second trap DNA binds a molecular input bound to the first molecule and the third molecule when the storage state of the nanoparticle memory indicates logic 1.

7. The nano computing device of claim 1, wherein:
the first instruction molecule includes a trap DNA that binds the nanoparticle floater to the nanoparticle memory,
the second instruction molecule includes a report DNA that binds the nanoparticle floater to the nanoparticle reporter, and
a rate difference between the first reaction rate and the second reaction rate is adjusted according to at least one of:
a DNA hybridization domain configuring each of the first to fourth molecules, hybridization domains of the trap DNA and the report DNA, a concentration of the nanoparticle memory, a concentration of the nanoparticle reporter, a concentration of the nanoparticle floater, and a concentration of the trap DNA and the report DNA.

8. The nano computing device of claim 1, wherein:
the nanoparticle memory and the nanoparticle reporter are fixed to a supported lipid bilayer membrane, and the nanoparticle floater is mobile on the supported lipid bilayer membrane.

9. A nano computing device, comprising:
a plurality of molecular inputs;
a plurality of nanoparticle memories configured to store the plurality of molecular inputs;

wherein each nanoparticle memory of the plurality of nanoparticle memories comprises a nanoparticle functionalized with a plurality of single-stranded DNA domains configured to hybridize with an input DNA representing a logic "0" or logic "1", the input DNA modifying an exposed single-stranded region of the nanoparticle memory so as to define its storage state;
a plurality of instruction molecules programmed for performing a logic operation;
a plurality of nanoparticle reporters configured to determine an output; wherein each nanoparticle reporter of the plurality of nanoparticle reporters comprises a nanoparticle functionalized with a plurality of reporter-binding DNA domains configured to bind a nanoparticle floater through multivalent hybridization with a report DNA strand having a hybridization domain of lower melting temperature than trap DNA, such that assembly of the nanoparticle floater to the nanoparticle reporter produces a detectable optical scattering change representing a logic output; and
a plurality of nanoparticle floaters bound to the plurality of nanoparticle memory or the plurality of nanoparticle reporters based on the molecular inputs and the instruction molecules; wherein each nanoparticle floater of the plurality of nanoparticle floaters comprises a mobile nanoparticle possessing at least two distinct hybridization domains, including (i) a trap-binding domain configured to hybridize to a memory-specific trap DNA corresponding to the storage state of the nanoparticle memory, and (ii) a reporter-binding domain configured to hybridize to a report DNA for assembly to the nanoparticle reporter, the nanoparticle floater being freely diffusible on a supported lipid bilayer until selectively captured by trap DNA or report DNA;
wherein:
each of the plurality of nanoparticle floaters is selectively bound to the nanoparticle memory over the nanoparticle reporter due to a competition wherein a first reaction rate between the nanoparticle memory and the nanoparticle floater by a first instruction molecule among the instruction molecules is faster than a second reaction rate between the nanoparticle reporter and the nanoparticle floater by a second instruction molecule among the instruction molecules; wherein the first reaction rate comprises a diffusion-limited hybridization of a trap DNA having a hybridization domain length of about 14 nucleotides and a melting temperature above about 40° C., resulting in rapid nanoparticle memory-nanoparticle floater assembly; and wherein the second reaction rate comprises a slower, kinetically delayed assembly via a report DNA having a hybridization domain of about 8 nucleotides and a melting temperature below about 20° C., such that reporter assembly requires multivalent interactions and proceeds only after a trap-DNA-mediated reaction window has elapsed.

10. The nano computing device of claim 9, wherein:
the plurality of molecular inputs includes at least one of two types of a first molecular input and a second molecular input, and
the plurality of nanoparticle memory includes a first nanoparticle memory and a second nanoparticle memory that store at least one of the first molecular input and the second molecular input.

11. The nano computing device of claim 10, wherein:
the plurality of nanoparticle floaters is bound to the first nanoparticle memory by a first trap molecule among the plurality of instruction molecules, is bound to the second nanoparticle memory by a second trap molecule among the plurality of instruction molecules, and is bound to one of the plurality of nanoparticle reporters by a report molecule among the plurality of instruction molecules.

12. The nano computing device of claim 11, wherein:
the first trap molecule binds one of the plurality of nanoparticle floaters to the first nanoparticle memory when a molecular input is not stored in the first nanoparticle memory, and
the second trap molecule binds one of the plurality of nanoparticle floaters to the second nanoparticle memory when a molecular input is not stored in the second nanoparticle memory.

13. The nano computing device of claim 11, wherein:
the first trap molecule binds one of the plurality of nanoparticle floaters to the first nanoparticle memory when a molecular input is not stored in the first nanoparticle memory, and
the second trap molecule binds one of the plurality of nanoparticle floaters to the second nanoparticle memory when a second molecular input is stored in the second nanoparticle memory.

14. The nano computing device of claim 11, wherein:
the first trap molecule binds one of the plurality of nanoparticle floaters to the first nanoparticle memory when a first molecular input is stored in the first nanoparticle memory, and
the second trap molecule binds one of the plurality of nanoparticle floaters to the second nanoparticle memory when a second molecular input is stored in the second nanoparticle memory.

15. The nano computing device of claim 10, wherein:
the plurality of nanoparticle floaters includes two types including a first nanoparticle floater and a second nanoparticle floater,
the first nanoparticle floater is bound to the first nanoparticle memory by a first trap molecule among the plurality of instruction molecules and is bound to one of the plurality of nanoparticle reporters by a report molecule among the plurality of instruction molecules, and
the second nanoparticle floater is bound to the first nanoparticle memory by a second trap molecule among the plurality of instruction molecules, is bound to the second nanoparticle memory by a third trap molecule among the plurality of instruction molecules, and is bound to another one of the plurality of nanoparticle reporters by a report molecule among the plurality of instruction molecules.

16. The nano computing device of claim 15, wherein:
the first trap molecule binds the first nanoparticle floater and the first nanoparticle memory when a molecular input is not stored in the first nanoparticle memory,
the second trap molecule binds the second nanoparticle floater and the first nanoparticle memory when a first molecular input is stored in the first nanoparticle memory, and
the third trap molecule binds the second nanoparticle floater and the second nanoparticle memory when a molecular input is not stored in the second nanoparticle memory.

17. The nano computing device of claim 15, wherein:
the first trap molecule binds the first nanoparticle floater and the first nanoparticle memory when a first molecular input is not stored in the first nanoparticle memory, the second trap molecule binds the second nanoparticle floater and the first nanoparticle memory when a molecular input is not stored in the first nanoparticle memory, and
the third trap molecule binds the second nanoparticle floater and the second nanoparticle memory when a second molecular input is stored in the second nanoparticle memory.

18. The nano computing device of claim 10, wherein:
the plurality of nanoparticle floaters includes two types including a first nanoparticle floater and a second nanoparticle floater, and
the first nanoparticle floater is bound to the first nanoparticle memory by a first trap molecule among the plurality of instruction molecules, is bound to the second nanoparticle memory by a second trap molecule among the plurality of instruction molecules, and is bound to one of the plurality of nanoparticle reporters by a report molecule among the plurality of instruction molecules, and
the second nanoparticle floater is bound to the first nanoparticle memory by a third trap molecule among the plurality of instruction molecules, is bound to the second nanoparticle memory by a fourth trap molecule among the plurality of instruction molecules, and is bound to another one of the plurality of nanoparticle reporters by a report molecule among the plurality of instruction molecules.

19. The nano computing device of claim 18, wherein:
the first trap molecule binds the first nanoparticle floater and the first nanoparticle memory when a molecular input is not stored in the first nanoparticle memory,
the second trap molecule binds the first nanoparticle floater and the second nanoparticle memory when a second molecular input is stored in the second nanoparticle memory,
the third trap molecule binds the second nanoparticle floater and the first nanoparticle memory when a first molecular input is stored in the first nanoparticle memory, and
the fourth trap molecule binds the second nanoparticle floater and the second nanoparticle memory when a molecular input is not stored in the second nanoparticle memory.

20. The nano computing device of claim 18, wherein:
the first trap molecule binds the first nanoparticle floater and the first nanoparticle memory when a molecular input is not stored in the first nanoparticle memory,
the second trap molecule binds the first nanoparticle floater and the second nanoparticle memory when a molecular input is not stored in the second nanoparticle memory,
the third trap molecule binds the second nanoparticle floater and the first nanoparticle memory when a first molecular input is stored in the first nanoparticle memory, and
the fourth trap molecule binds the second nanoparticle floater and the second nanoparticle memory when a second molecular input is stored in the second nanoparticle memory.

21. A nano computing device, comprising:
an input layer including a plurality of nanoparticle memories; wherein each nanoparticle memory of the plurality of nanoparticle memories comprises a nanoparticle functionalized with a plurality of single-stranded DNA domains configured to hybridize with an input DNA representing a logic "0" or logic "1", the input DNA modifying an exposed single-stranded region of the nanoparticle memory so as to define its storage state;

a hidden layer including a plurality of nanoparticle floaters; wherein each nanoparticle floater of the plurality of nanoparticle floaters comprises a mobile nanoparticle possessing at least two distinct hybridization domains, including (i) a trap-binding domain configured to hybridize to a memory-specific trap DNA corresponding to the storage state of the nanoparticle memory, and (ii) a reporter-binding domain configured to hybridize to a report DNA for assembly to the nanoparticle reporter, the nanoparticle floater being freely diffusible on a supported lipid bilayer until selectively captured by trap DNA or report DNA; and an output layer including a plurality of nanoparticle reporters; wherein each nanoparticle reporter of the plurality of nanoparticle reporters comprises a nanoparticle functionalized with a plurality of reporter-binding DNA domains configured to bind a nanoparticle floater through multivalent hybridization with a report DNA strand having a hybridization domain of lower melting temperature than trap DNA, such that assembly of the nanoparticle floater to the nanoparticle reporter produces a detectable optical scattering change representing a logic output;

wherein the nano computing device is programmed with a nanoparticle neural network including a plurality of instruction molecules corresponding to weights between the input layer and the hidden layer and between the hidden layer and the output layer; and wherein:

each of the plurality of nanoparticle floaters is selectively bound to the nanoparticle memory over the nanoparticle reporter due to a competition wherein a first reaction rate between the nanoparticle memory and the nanoparticle floater by a first instruction molecule among the plurality of instruction molecules is faster than a second reaction rate between the nanoparticle reporter and the nanoparticle floater by a second instruction molecule among the plurality of instruction molecules; wherein the first reaction rate comprises a diffusion-limited hybridization of a trap DNA having a hybridization domain length of about 14 nucleotides and a melting temperature above about 40° C., resulting in rapid nanoparticle memory-nanoparticle floater assembly; and wherein the second reaction rate comprises a slower, kinetically delayed assembly via a report DNA having a hybridization domain of about 8 nucleotides and a melting temperature below about 20° C., such that reporter assembly requires multivalent interactions and proceeds only after the trap-DNA-mediated reaction window has elapsed.

22. The nano computing device of claim 21, wherein:

the plurality of instruction molecules includes a plurality of trap molecules that controls binding between the plurality of nanoparticle memories and the plurality of nanoparticle floaters based on a storage state of the plurality of nanoparticle memories, and the type of the plurality of trap molecules is different according to the nanoparticle neural network.

* * * * *

SEQUENCE LISTING

<160> NUMBER OF SEQ ID NOS: 50

<210> SEQ ID NO 1
<211> LENGTH: 39
<212> TYPE: DNA
<213> ORGANISM: Artificial Sequence
<220> FEATURE:
<223> OTHER INFORMATION: Synthetic

<400> SEQUENCE: 1
aaaaaaaaaa aaaaaaactg ccattcattt accgtctac                            39

<210> SEQ ID NO 2
<211> LENGTH: 39
<212> TYPE: DNA
<213> ORGANISM: Artificial Sequence
<220> FEATURE:
<223> OTHER INFORMATION: Synthetic

<400> SEQUENCE: 2
aaaaaaaaaa aaaaataaac ccatgctaac cgctaacac                            39

<210> SEQ ID NO 3
<211> LENGTH: 39
<212> TYPE: DNA
<213> ORGANISM: Artificial Sequence
<220> FEATURE:
<223> OTHER INFORMATION: Synthetic

<400> SEQUENCE: 3
aaaaaaaaaa aaaaatctta aagtcccgtc acagtctac                            39

<210> SEQ ID NO 4
<211> LENGTH: 39
<212> TYPE: DNA
<213> ORGANISM: Artificial Sequence
<220> FEATURE:
<223> OTHER INFORMATION: Synthetic

<400> SEQUENCE: 4
aaaaaaaaaa aaaaaaccaa agacccaaga tactcgcac                            39

<210> SEQ ID NO 5
<211> LENGTH: 39
<212> TYPE: DNA
<213> ORGANISM: Artificial Sequence
<220> FEATURE:
<223> OTHER INFORMATION: Synthetic

<400> SEQUENCE: 5
aaaaaaaaaa aaaaacgcac taagacgaat tcacttttc                            39

<210> SEQ ID NO 6
<211> LENGTH: 75
<212> TYPE: DNA
<213> ORGANISM: Artificial Sequence
<220> FEATURE:
<223> OTHER INFORMATION: Synthetic

<400> SEQUENCE: 6
aaaaaaaaaa aaaaaataac gagcatcgaa cttacatcgc gttactacac tgtcactgat    60
catcgcatgc tatac                                                     75

<210> SEQ ID NO 7
<211> LENGTH: 39

-continued

```
<212> TYPE: DNA
<213> ORGANISM: Artificial Sequence
<220> FEATURE:
<223> OTHER INFORMATION: Synthetic

<400> SEQUENCE: 7
cacaacatag aatcacgtac ataaaaaaaa aaaaaaaaa                        39

<210> SEQ ID NO 8
<211> LENGTH: 39
<212> TYPE: DNA
<213> ORGANISM: Artificial Sequence
<220> FEATURE:
<223> OTHER INFORMATION: Synthetic

<400> SEQUENCE: 8
ccgttctaca aatcaaagcg catcaaaaaa aaaaaaaaa                        39

<210> SEQ ID NO 9
<211> LENGTH: 39
<212> TYPE: DNA
<213> ORGANISM: Artificial Sequence
<220> FEATURE:
<223> OTHER INFORMATION: Synthetic

<400> SEQUENCE: 9
ctcgtcactc tagcacaatc tcgaaaaaaa aaaaaaaaa                        39

<210> SEQ ID NO 10
<211> LENGTH: 39
<212> TYPE: DNA
<213> ORGANISM: Artificial Sequence
<220> FEATURE:
<223> OTHER INFORMATION: Synthetic

<400> SEQUENCE: 10
cataatctat aatcatcctc ataaaaaaaa aaaaaaaaa                        39

<210> SEQ ID NO 11
<211> LENGTH: 49
<212> TYPE: DNA
<213> ORGANISM: Artificial Sequence
<220> FEATURE:
<223> OTHER INFORMATION: Synthetic

<400> SEQUENCE: 11
ctctctgcct cgttcagaca aaactcatcc tactaaaaaa aaaaaaaaa             49

<210> SEQ ID NO 12
<211> LENGTH: 39
<212> TYPE: DNA
<213> ORGANISM: Artificial Sequence
<220> FEATURE:
<223> OTHER INFORMATION: Synthetic

<400> SEQUENCE: 12
caataacgac aaactaattc agcaaaaaaa aaaaaaaaa                        39

<210> SEQ ID NO 13
<211> LENGTH: 75
<212> TYPE: DNA
<213> ORGANISM: Artificial Sequence
<220> FEATURE:
<223> OTHER INFORMATION: Synthetic

<400> SEQUENCE: 13
```

-continued

```
ctctctgcct cgttcagaca aaactcatcc tactcgatac tttctgtaac ttttccttaa      60
aaaaaaaaaa aaaaa                                                       75

<210> SEQ ID NO 14
<211> LENGTH: 38
<212> TYPE: DNA
<213> ORGANISM: Artificial Sequence
<220> FEATURE:
<223> OTHER INFORMATION: Synthetic

<400> SEQUENCE: 14
ttatgtacgt gattctatgt tgtggattgt tttctagg                              38

<210> SEQ ID NO 15
<211> LENGTH: 38
<212> TYPE: DNA
<213> ORGANISM: Artificial Sequence
<220> FEATURE:
<223> OTHER INFORMATION: Synthetic

<400> SEQUENCE: 15
gatgcgcttt gatttgtaga acgggatagg cgacatag                              38

<210> SEQ ID NO 16
<211> LENGTH: 38
<212> TYPE: DNA
<213> ORGANISM: Artificial Sequence
<220> FEATURE:
<223> OTHER INFORMATION: Synthetic

<400> SEQUENCE: 16
tcgagattgt gctagagtga cgaggatgtc agggacag                              38

<210> SEQ ID NO 17
<211> LENGTH: 38
<212> TYPE: DNA
<213> ORGANISM: Artificial Sequence
<220> FEATURE:
<223> OTHER INFORMATION: Synthetic

<400> SEQUENCE: 17
ttatgaggat gattatagat tatggtattt agaaaatg                              38

<210> SEQ ID NO 18
<211> LENGTH: 32
<212> TYPE: DNA
<213> ORGANISM: Artificial Sequence
<220> FEATURE:
<223> OTHER INFORMATION: Synthetic

<400> SEQUENCE: 18
cgttattgaa tccttagaga aaagtgaatt cg                                    32

<210> SEQ ID NO 19
<211> LENGTH: 38
<212> TYPE: DNA
<213> ORGANISM: Artificial Sequence
<220> FEATURE:
<223> OTHER INFORMATION: Synthetic

<400> SEQUENCE: 19
gattctatgt tgtgccttca ttaagtagac ggtaaatg                              38

<210> SEQ ID NO 20
<211> LENGTH: 38
```

-continued

```
<212> TYPE: DNA
<213> ORGANISM: Artificial Sequence
<220> FEATURE:
<223> OTHER INFORMATION: Synthetic

<400> SEQUENCE: 20
cctagaaaac aatctctcgt attcgtagac ggtaaatg                               38

<210> SEQ ID NO 21
<211> LENGTH: 38
<212> TYPE: DNA
<213> ORGANISM: Artificial Sequence
<220> FEATURE:
<223> OTHER INFORMATION: Synthetic

<400> SEQUENCE: 21
gatttgtaga acggatatca ttacgtagac ggtaaatg                               38

<210> SEQ ID NO 22
<211> LENGTH: 38
<212> TYPE: DNA
<213> ORGANISM: Artificial Sequence
<220> FEATURE:
<223> OTHER INFORMATION: Synthetic

<400> SEQUENCE: 22
ctatgtcgcc tatccatata cagcgtagac ggtaaatg                               38

<210> SEQ ID NO 23
<211> LENGTH: 38
<212> TYPE: DNA
<213> ORGANISM: Artificial Sequence
<220> FEATURE:
<223> OTHER INFORMATION: Synthetic

<400> SEQUENCE: 23
gctagagtga cgagaagata taccgtagac ggtaaatg                               38

<210> SEQ ID NO 24
<211> LENGTH: 38
<212> TYPE: DNA
<213> ORGANISM: Artificial Sequence
<220> FEATURE:
<223> OTHER INFORMATION: Synthetic

<400> SEQUENCE: 24
ctgtccctga catcttctta tctcgtagac ggtaaatg                               38

<210> SEQ ID NO 25
<211> LENGTH: 38
<212> TYPE: DNA
<213> ORGANISM: Artificial Sequence
<220> FEATURE:
<223> OTHER INFORMATION: Synthetic

<400> SEQUENCE: 25
gattatagat tatgcctacg tctagtagac ggtaaatg                               38

<210> SEQ ID NO 26
<211> LENGTH: 38
<212> TYPE: DNA
<213> ORGANISM: Artificial Sequence
<220> FEATURE:
<223> OTHER INFORMATION: Synthetic

<400> SEQUENCE: 26
```
cattttctaa atacacagct aacagtagac ggtaaatg                                38

<210> SEQ ID NO 27
<211> LENGTH: 38
<212> TYPE: DNA
<213> ORGANISM: Artificial Sequence
<220> FEATURE:
<223> OTHER INFORMATION: Synthetic

<400> SEQUENCE: 27
gattctatgt tgtgttcttt accagtgtta gcggttag                                38

<210> SEQ ID NO 28
<211> LENGTH: 38
<212> TYPE: DNA
<213> ORGANISM: Artificial Sequence
<220> FEATURE:
<223> OTHER INFORMATION: Synthetic

<400> SEQUENCE: 28
cctagaaaac aatctatgcc tactgtgtta gcggttag                                38

<210> SEQ ID NO 29
<211> LENGTH: 38
<212> TYPE: DNA
<213> ORGANISM: Artificial Sequence
<220> FEATURE:
<223> OTHER INFORMATION: Synthetic

<400> SEQUENCE: 29
gatttgtaga acggaacatt accagtgtta gcggttag                                38

<210> SEQ ID NO 30
<211> LENGTH: 38
<212> TYPE: DNA
<213> ORGANISM: Artificial Sequence
<220> FEATURE:
<223> OTHER INFORMATION: Synthetic

<400> SEQUENCE: 30
ctatgtcgcc tatcttaaac cgtagtgtta gcggttag                                38

<210> SEQ ID NO 31
<211> LENGTH: 38
<212> TYPE: DNA
<213> ORGANISM: Artificial Sequence
<220> FEATURE:
<223> OTHER INFORMATION: Synthetic

<400> SEQUENCE: 31
gctagagtga cgagatacca aatagtgtta gcggttag                                38

<210> SEQ ID NO 32
<211> LENGTH: 38
<212> TYPE: DNA
<213> ORGANISM: Artificial Sequence
<220> FEATURE:
<223> OTHER INFORMATION: Synthetic

<400> SEQUENCE: 32
ctgtccctga catcactact atttgtgtta gcggttag                                38

<210> SEQ ID NO 33
<211> LENGTH: 38
<212> TYPE: DNA
<213> ORGANISM: Artificial Sequence
<220> FEATURE:
<223> OTHER INFORMATION: Synthetic

<400> SEQUENCE: 33
gattatagat tatgacagtc gcaggtgtta gcggttag                                 38

<210> SEQ ID NO 34
<211> LENGTH: 38
<212> TYPE: DNA
<213> ORGANISM: Artificial Sequence
<220> FEATURE:
<223> OTHER INFORMATION: Synthetic

<400> SEQUENCE: 34
cattttctaa ataccacggc cttggtgtta gcggttag                                 38

<210> SEQ ID NO 35
<211> LENGTH: 38
<212> TYPE: DNA
<213> ORGANISM: Artificial Sequence
<220> FEATURE:
<223> OTHER INFORMATION: Synthetic

<400> SEQUENCE: 35
gattctatgt tgtgagcttc atgcgtagac tgtgacgg                                 38

<210> SEQ ID NO 36
<211> LENGTH: 38
<212> TYPE: DNA
<213> ORGANISM: Artificial Sequence
<220> FEATURE:
<223> OTHER INFORMATION: Synthetic

<400> SEQUENCE: 36
cctagaaaac aatctccagt ctttgtagac tgtgacgg                                 38

<210> SEQ ID NO 37
<211> LENGTH: 38
<212> TYPE: DNA
<213> ORGANISM: Artificial Sequence
<220> FEATURE:
<223> OTHER INFORMATION: Synthetic

<400> SEQUENCE: 37
gatttgtaga acggaaccta gtaagtagac tgtgacgg                                 38

<210> SEQ ID NO 38
<211> LENGTH: 38
<212> TYPE: DNA
<213> ORGANISM: Artificial Sequence
<220> FEATURE:
<223> OTHER INFORMATION: Synthetic

<400> SEQUENCE: 38
ctatgtcgcc tatctaacct tacagtagac tgtgacgg                                 38

<210> SEQ ID NO 39
<211> LENGTH: 38
<212> TYPE: DNA
<213> ORGANISM: Artificial Sequence
<220> FEATURE:
<223> OTHER INFORMATION: Synthetic

<400> SEQUENCE: 39
gctagagtga cgagcttgca aacagtagac tgtgacgg                                 38

```
<210> SEQ ID NO 40
<211> LENGTH: 38
<212> TYPE: DNA
<213> ORGANISM: Artificial Sequence
<220> FEATURE:
<223> OTHER INFORMATION: Synthetic

<400> SEQUENCE: 40
ctgtccctga catctaatca agcagtagac tgtgacgg                         38

<210> SEQ ID NO 41
<211> LENGTH: 38
<212> TYPE: DNA
<213> ORGANISM: Artificial Sequence
<220> FEATURE:
<223> OTHER INFORMATION: Synthetic

<400> SEQUENCE: 41
gattatagat tatgaaccta gtaagtagac tgtgacgg                         38

<210> SEQ ID NO 42
<211> LENGTH: 38
<212> TYPE: DNA
<213> ORGANISM: Artificial Sequence
<220> FEATURE:
<223> OTHER INFORMATION: Synthetic

<400> SEQUENCE: 42
cattttctaa atactaacct tacagtagac tgtgacgg                         38

<210> SEQ ID NO 43
<211> LENGTH: 38
<212> TYPE: DNA
<213> ORGANISM: Artificial Sequence
<220> FEATURE:
<223> OTHER INFORMATION: Synthetic

<400> SEQUENCE: 43
gattctatgt tgtgttacaa taacgtgcga gtatcttg                         38

<210> SEQ ID NO 44
<211> LENGTH: 38
<212> TYPE: DNA
<213> ORGANISM: Artificial Sequence
<220> FEATURE:
<223> OTHER INFORMATION: Synthetic

<400> SEQUENCE: 44
cctagaaaac aatctatcac acaggtgcga gtatcttg                         38

<210> SEQ ID NO 45
<211> LENGTH: 38
<212> TYPE: DNA
<213> ORGANISM: Artificial Sequence
<220> FEATURE:
<223> OTHER INFORMATION: Synthetic

<400> SEQUENCE: 45
gatttgtaga acggacactt tgcggtgcga gtatcttg                         38

<210> SEQ ID NO 46
<211> LENGTH: 38
<212> TYPE: DNA
<213> ORGANISM: Artificial Sequence
<220> FEATURE:
<223> OTHER INFORMATION: Synthetic
```

-continued

```
<400> SEQUENCE: 46
ctatgtcgcc tatccaaata gaatgtgcga gtatcttg                                          38

<210> SEQ ID NO 47
<211> LENGTH: 38
<212> TYPE: DNA
<213> ORGANISM: Artificial Sequence
<220> FEATURE:
<223> OTHER INFORMATION: Synthetic

<400> SEQUENCE: 47
gctagagtga cgagatatca caaggtgcga gtatcttg                                          38

<210> SEQ ID NO 48
<211> LENGTH: 38
<212> TYPE: DNA
<213> ORGANISM: Artificial Sequence
<220> FEATURE:
<223> OTHER INFORMATION: Synthetic

<400> SEQUENCE: 48
ctgtccctga catctactta cgatgtgcga gtatcttg                                          38

<210> SEQ ID NO 49
<211> LENGTH: 38
<212> TYPE: DNA
<213> ORGANISM: Artificial Sequence
<220> FEATURE:
<223> OTHER INFORMATION: Synthetic

<400> SEQUENCE: 49
gattatagat tatgacactt tgcggtgcga gtatcttg                                          38

<210> SEQ ID NO 50
<211> LENGTH: 38
<212> TYPE: DNA
<213> ORGANISM: Artificial Sequence
<220> FEATURE:
<223> OTHER INFORMATION: Synthetic

<400> SEQUENCE: 50
cattttctaa ataccaaata gaatgtgcga gtatcttg                                          38
```